United States Patent
Nakata et al.

[11] Patent Number: 6,074,893
[45] Date of Patent: Jun. 13, 2000

[54] PROCESS FOR FORMING FINE THICK-FILM CONDUCTOR PATTERNS

[75] Inventors: Yoshikazu Nakata, Kobe; Syozo Otomo, Asa-gun; Kazunari Tanaka, Mine; Koichi Uno, Nagoya, all of Japan

[73] Assignees: Sumitomo Metal Industries, Ltd., Osaka; Sumitomo Metal Ceramics Inc., Yamagushi, both of Japan

[21] Appl. No.: 08/863,279

[22] Filed: May 27, 1997

Related U.S. Application Data

[63] Continuation-in-part of application No. 08/312,690, Sep. 26, 1994, abandoned.

[30] Foreign Application Priority Data

| Sep. 27, 1993 | [JP] | Japan | 239718/93 |
| Sep. 28, 1993 | [JP] | Japan | 240843/93 |
| Oct. 22, 1993 | [JP] | Japan | 264477/93 |
| Nov. 19, 1993 | [JP] | Japan | 290279/93 |
| Nov. 24, 1993 | [JP] | Japan | 293063/93 |
| May 4, 1994 | [JP] | Japan | 67276/94 |

[51] Int. Cl.$^7$ .......................... H01L 21/44; H01L 21/48; H01L 21/50
[52] U.S. Cl. .......................... 438/106; 438/107; 438/110; 438/113; 438/460
[58] Field of Search .................. 438/106, 107, 438/110, 113, 460

[56] References Cited

U.S. PATENT DOCUMENTS

| 4,555,285 | 11/1985 | Chance et al. ............. 156/89 |
| 5,284,796 | 2/1994 | Nakanishi et al. . |
| 5,397,401 | 3/1995 | Toma et al. . |
| 5,460,921 | 10/1995 | Cywar et al. ............. 430/324 |
| 5,460,922 | 10/1995 | Swirbel et al. ............ 430/324 |
| 5,478,700 | 12/1995 | Gaynes et al. ............. 430/315 |
| 5,573,620 | 11/1996 | Sakai et al. . |
| 5,783,465 | 7/1998 | Canning et al. . |

OTHER PUBLICATIONS

Grant et al., Grant & Hackh's Chemical Dictionary, Fifth ed., McGraw Hill, Bokk Company, New York, NY 1987, p. 533, "sintering".

The American Heritage Dictionary, Second College Edition, Houghton Mifflin Company, Boston, MA, 1982, pp. 349–350.

*Primary Examiner*—Kevin M. Picardat
*Assistant Examiner*—D. M. Collins
*Attorney, Agent, or Firm*—Armstrong, Westerman, Hattori, McLeland and Naughton

[57] ABSTRACT

A process for forming fine thick-film conductor patterns on a ceramic substrate which comprises the steps of forming grooves in a positive-working photoresist layer on the substrate by the photolithographic technology, filling the grooves with a conductive paste by squeezing with a squeegee, removing the photoresist layer by a wet process, and firing the remaining conductive paste pattern is improved. By the improvements, the conductive paste is squeezed into the grooves by the screen printing technique using a mask, and/or the solvent in the conducive paste consists essentially of one or more hydrocarbons, and/or the squeegee is made of a material having a flexural modulus in a range of 30–200 kgf/mm$^2$. The formation of the grooves may be accomplished by laser beam machining; in this case a negative-working photoresist or any other soluble resin may be used to form the grooves therein. Also provided are a process for forming a fine thick-film conductor pattern by means of transfer of a conductive paste pattern formed on a support film to a green sheet, as well as a process for forming bumps on a ceramic circuit substrate.

30 Claims, 6 Drawing Sheets

(a)

(b)

(c)

(d)

(e)

(f)

PROCESS FOR FORMING FINE THICK-FILM CONDUCTOR PATTERNS

This application is a continuation-in-part of application Ser. No. 08/312,690, filed Sep. 26, 1994 abandoned.

BACKGROUND OF THE INVENTION

This invention relates to a process for forming fine thick-film conductor patterns. More particularly, the invention relates to a process for forming fine thick-film conductor patterns on ceramic circuit substrates or ceramic green sheets for use in mounting IC (e.g., LSI) chips and other electronic components or interconnecting them. The invention also relates to a process for forming connecting bumps on the surface of ceramic substrates for flip-chip bonding.

With a recent trend in the electronic industry towards fabricating smaller devices of higher performance, the practice of using semiconductor packages having more pins with smaller pitches or accommodating multiple chips on a single substrate has accelerated. The LSI bonding technology is also making a shift from the conventional wire bonding process to wireless bonding such as the TAB (tape-automated bonding) or flip-chip bonding process which is suitable for multi-chip devices and high-density packaging. As the packing density of electronic devices thus increases, it is required in the art of ceramic circuit substrates used to mount them to develop a technology capable of forming fine thick-film conductor patterns such as fine interconnecting lines with a line width of no more 100 $\mu$m and bumps or electrodes with a diameter of no more than 100 $\mu$m.

The formation of conductor patterns for circuit on ceramic substrates is generally performed by a thin-film deposition, plating, or thick-film deposition process.

In the thin-film deposition process, a metallized layer is formed to a thickness on the order of several microns on the ceramic substrate by vacuum deposition, sputtering, ion plating, or a similar vapor-phase technique, and it is then patterned by a photolithographic technique using a photoresist. This process is capable of forming highly precise conductor patterns but, on the other hand, it has the following disadvantages: the conductor patterns have low adhesion to the substrate; the method involves an increased number of steps and requires the use of an expensive thin-film forming apparatus and, hence, the fabrication cost is high; and the formed conductor patterns are so thin that it is difficult to pass a large current therethrough.

In the plating process, a thin metallized layer is formed on the ceramic substrate from a solution by means of an electrochemical technique and is then patterned in the same manner as described above. This process also suffers from most of the above-described disadvantages of the thin-film deposition process.

In the thick-film deposition process, a conductive paste comprising a conductor component (metal powder) dispersed in a liquid vehicle of an organic solvent containing an organic resin as a binder is screen-printed onto the ceramic substrate followed by firing to form a relatively thick conductor pattern on the substrate.

The ceramic substrate to be used in the thick-film process is not necessarily a sintered ceramic substrate. Instead, a ceramic green sheet may be used to apply a conductive paste to form a paste pattern thereon and it is then co-fired with the applied conductive paste. This technique is employed in a well-known green sheet multilayer lamination process, in which a plurality of ceramic green sheets each having a conductive paste pattern formed by screen printing are laminated and co-fired to produce a multilayer ceramic circuit substrate.

The thick-film process allows for low-cost formation of a conductor pattern having an adequate strength of adhesion to the ceramic substrate and capable of passing a large current therethrough.

When a ceramic green sheet is used for screen printing with a conductive paste in this process, the liquid component of the printed conductive paste is quickly absorbed by the green sheet, thereby making it possible to form a conductor pattern with a small line width and spacing of no more than 150 $\mu$m. In contrast, when a conductive paste is applied to a sintered ceramic substrate, the liquid component will not be readily absorbed by the substrate but spreads laterally to cause "blur" or "slump" of the paste, thereby making it difficult to form the as-designed conductor pattern having a line width and spacing of no more than 150 $\mu$m.

Under the circumstances, an attempt has been made to combine the formation of conductor patterns by the thick-film process with the photolithographic technology which has predominantly been employed in the thin-film process. According to this method, a photoresist layer is first formed on the surface of a sintered ceramic substrate, and a photolithographic technique including imagewise exposure to radiation (light) and development is then applied to the photoresist layer so as to form grooves therein having a pattern which corresponds to the desired fine conductor pattern. Subsequently, the grooves are filled with a conductive paste by squeezing the paste into the grooves with a squeegee, and the substrate is fired to sinter the conductor component in the paste and simultaneously remove the photoresist layer and any other organic substances by decomposition (see, for example, Japanese Patent Applications Laid-Open (Kokai) Nos. 223391/1992, 223392/1992, and 223393/1992).

The firing to pyrolytically remove the photoresist layer is generally performed at around 900° C. in an oxidizing atmosphere. However, it takes a considerably long time for the photoresist layer to be completely burnt out. If the conductor component of the conductive paste is susceptible to oxidation as is the case with Cu or Mo-Mn, it will be readily oxidized during the firing in an oxidizing atmosphere, thereby resulting in the formation of a conductor pattern having a substantially increased resistivity. To avoid this problem, a relatively expensive conductive paste in which a noble metal such as Au, Ag, Ag/Pd, Pd, or Pt is used as the conductor component must be used in this method.

It has also been proposed with respect to this method that the firing step to burn out the photoresist layer in an oxidizing atmosphere is followed by a step of reducing the oxidized conductor metal, but this approach is less preferred since it increases the number of process steps.

Japanese Patent Application Laid-Open (Kokai) No. 240996/1990 proposes the use of a positive-working photoresist in the above-described method of forming thick-film conductor patterns by the photolithographic technology. According to this method, after patterned grooves are formed in the photoresist layer (which is positive-working) by imagewise exposure and development and they are filled with a conductive paste by squeezing, the photoresist layer is subjected to blanket exposure, whereupon it becomes soluble in a developing solution and hence can be removed by a wet process rather than firing. After removal of the photoresist layer by a wet process, firing is performed in order to sinter the conductor component of the conductive paste and, in this case, the firing atmosphere may be non-oxidizing. As a result, conductive pastes in which the conductor component is an oxidation-susceptible metal such as Cu or Mo-Mn can be employed to form thick-film conductor patterns without oxidation of the conductor metal which leads to an increased resistivity.

However, this method still has the following problems.

(1) In the step of squeezing the conductive paste into the patterned grooves of the photoresist layer, a skin of the paste will also be unavoidably deposited on the top surfaces of the photoresist layer. Unless this skin of the conductive paste is removed prior to firing, it remains after firing to form a thin conductor layer between interconnecting lines in the designed thick-film conductor pattern, which may cause short circuit.

The skin of the conductive paste deposited on the photoresist layer can be removed by polishing the surface of the photoresist layer, but this increases the number of process steps. In addition, it is difficult to achieve uniform polishing and, therefore, surface irregularities tend to occur in the formed conductor pattern.

(2) The solvents generally used in the conventional conductive pastes are polar solvents, particularly alcoholic or ester solvents such as terpineol, butylcarbitol, and dibutyl phthalate, since they have a high dissolving power for the binder resin in the paste. The high dissolving power of these solvents, however, causes the photoresist layer having grooves filled with a conductive paste to be dissolved into the solvent of the conductive paste, thereby distorting the conductor pattern and impairing the sharpness of the profile thereof.

Furthermore, if a skin of the conductive paste is undesirably deposited on the photoresist layer as mentioned in (1), the solvent of the conductive paste present as the skin will dissolve the underlying photoresist layer, whereupon the deposited conductive paste will firmly adhere to the photoresist layer. This makes it difficult to ensure that the photoresist layer is completely removed with a developing solution in a subsequent step. In addition, the problem described in (1) is aggravated.

(3) The squeegee used to fill the grooves formed in the photoresist layer with the conductive paste is usually a rubber plate. Such a squeegee can successfully fill grooves having a width or diameter of no more than 100 μm. However, if the width or diameter of the grooves exceeds 100 μm, it is difficult to completely fill the grooves with the conductive paste using this squeegee. This is because the rubber squeegee will be flexed and partly get into the wide grooves so that part of the already filled conductive paste is scraped out of the grooves by the squeegee.

In common ceramic circuit substrates, interconnecting patterns having a width or diameter of no more than 100 μm exist together with those having a greater width or diameter. Therefore, the use of a rubber squeegee makes it difficult to completely fill all the grooves of the photoresist layer with the conductive paste.

It is conceivable to use a metallic plate as the squeegee in place of a rubber plate. Using the metallic plate, one can fill the grooves with the conductive paste almost completely even if the width or diameter of the grooves varies widely. However, the use of such a hard metallic squeegee makes a gap from the top surface of the photoresist layer when squeezing, resulting in the formation of a thick skin of the conductive paste deposited on the photoresist layer. As a result, the problem mentioned in (1) is aggravated, thereby increasing the possibility of short circuit. If the metallic squeegee is strongly pressed down during squeezing so as to avoid the formation of the thick skin of the conductive paste, the photoresist layer is damaged or deformed and the resulting interconnecting pattern does not have the desired accurate shape.

(4) The photoresist layer being formed is so thick that it is difficult even by the photolithographic technology to form a fine conductor pattern having a line spacing of 25 μm or less.

(5) A photomask is necessary to perform photolithography (in the imagewise exposure step), and a different photomask has to be fabricated for each different conductor pattern to be formed on the substrate. However, this is not economically advantageous in the production of multiple varieties in small lots.

(6) In order to achieve a satisfactory resolution, the photomask has to be placed in intimate contact with the photoresist layer formed on the ceramic substrate. However, due to the inherent subtle distortion of the ceramic substrate, there may be a gap between the photoresist layer and the photomask to deteriorate the resolution.

Japanese Patent Application Laid-Open (Kokai) No. 283946/1992 teaches a method of forming a fine thick-film conductor pattern on a ceramic green sheet rather than on a sintered ceramic substrate by the above-described photolithographic technology using a positive-working photoresist. According to this method, the conductive paste is squeezed into the grooves of the photoresist layer, which is subsequently removed, after blanket exposure, by a wet process using a developing solution while leaving a predetermined pattern of the conductive paste on the ceramic green sheet. A plurality of such ceramic green sheets are laminated by thermo-compression bonding, and the resulting laminate is fired to produce a multilayer interconnected ceramic substrate.

However, even this method is not perfect and has the following problems.

(7) The application of the photolithographic technology to a ceramic green sheet may cause the photoresist layer to be dissolved in the green sheet or cause the binder in the green sheet to be dissolved in the developing solution being used to remove the photoresist. In either case, the conductor pattern being formed on the green sheet tends to be deformed.

(8) The aforementioned problem of short circuit also occurs on account of the excessive conductive paste undesirably deposited on the photoresist layer.

(9) In the laminate, the thick-film conductor patterns formed on the individual ceramic green sheets are so raised that the individual green sheets will become distorted, thereby increasing the chance for delamination, warpage, and other defects to occur during the subsequent firing step.

As already described, the requirement of the recent model of semiconductor devices for smaller size and higher packing density has motivated the increasing shift from wire bonding or surface mounting technology (SMT) toward flip-chip bonding which is capable of higher-density packaging of IC chips.

FIG. 5 shows an IC chip that is joined to a ceramic circuit substrate by the flip-chip bonding scheme. A ceramic circuit substrate 31 has bumps 32 formed on one surface for connection to an IC chip, and an IC chip 33 also has bumps 34 formed on one surface. The two groups of bumps are electrically connected and fixed in position through a solder 35. The substrate 31 may be a glass substrate.

A common method of connecting the bumps 34 on the IC chip 33 to the bumps 32 on the substrate 31 comprises depositing the solder 35 usually on the bumps 34 of the IC chip 33, then placing the IC chip 33 on the substrate 31 such that the bumps 34 of the IC chip 33 having the solder 35 thereon are in contact with the bumps 32 on the substrate 31, and heating to fuse the solder 35. Since a space is ensured between the substrate 31 and the IC chip 33, flux residue and solder scum which may remain after soldering can be completely removed by cleaning to assure improved reliability. The flux is normally used with a solder.

For connecting a ceramic circuit substrate to a mother board, the DIP (dual-in-line package) and PGA (pin-grid array) techniques have heretofore been employed. However, for this connection, too, the need to satisfy the requirement for smaller size, higher packaging density, and lighter weight has prompted an attempt to perform the flip-chip bonding scheme, which is capable of direct surface mounting of the substrates on the mother board. This scheme is also called a BGA (ball-grid array) technique.

FIG. 6 illustrates how a ceramic circuit substrate is joined to a mother board by the flip-chip (BGA) technique. A ceramic circuit substrate 31 has bumps 32 formed on one surface for connection to a mother board 41, and the mother board 41 also has bumps 42 formed on one surface. The two groups of bumps are electrically connected and fixed in position through a solder 35. The bumps 32 on the substrate 31 can be connected to the bumps 42 on the mother board 41 by the same method as described with reference to FIG. 5.

FIG. 7 schematically shows an example of the ceramic circuit substrate 31 to be used for connecting to an IC chip by the flow-chip technique. In order to achieve high-density packaging, plural layers of internal interconnecting lines 37 are formed within the substrate 31, and individual internal interconnecting lines 37 are connected through via holes 38 filled with a conductive material. In order to connect the interconnecting lines 37 to an electronic device (not shown) by the flip-chip scheme, a bump 32 is formed at the end of each via hole 38 which is exposed on the surface of the substrate. As can be seen from FIG. 7, the bumps 32 to be formed on a substrate for high-density packaging are small in size and positioned with a narrow spacing. It is therefore necessary to form the bumps in high precision and with a high density.

The term "bumps of high precision" refers to those pads which have little fluctuation with respect to diameter, thickness (height), pitch (spacing), and other parameters, and the term "bumps of high density" refers to those pads which are small in diameter and pitch.

In contrast, the bumps used to mount the ceramic circuit substrate 31 on the mother board 31 by the flip-chip (BGA) technique as shown in FIG. 6 generally have a larger diameter and a lower density, yet they are also required to be formed with reasonably high precision.

Conventionally, the formation of bumps on a ceramic circuit substrate has been performed by screen printing with a conductive paste. The paste is then fired to form the bumps on the substrate, and the bumps are optionally overcoated, e.g., by Ni and Au plating or Cr-Cu vapor deposition. However, this screen-printing technology involves the following difficulties.

(10) FIG. 8 shows the connection of bumps 32 formed on a ceramic circuit substrate 31 by screen printing (using a screen mask having openings arranged in a predetermined pattern) to bumps 42 formed on a mother board 41 through a solder 35, which is deposited on the bumps 42 on the mother board 41. The print thickness attained by screen printing tends to fluctuate because the amount of the conductive paste that is extruded through the openings of the screen mask differs from one opening to another. As a result, the height of bumps 32 formed on the surface of the substrate 31 is not uniform but low bumps 32a intermingle with high bumps 32b and 32c. If the ceramic circuit substrate 31 having these bumps is mounted on the mother board 41 as shown in FIG. 8, a gap 36 forms between the low bumps 32a on the substrate 31 and the solder 35 deposited on the bumps 42 on the mother board 41, and this leads to connection failure. In addition, the shape of bumps is likely to be irregular.

(11) In the screen printing operation, the squeegee is moved as it holds down the screen. However, the screen mask flexes under the depressing force of the squeegee and, hence, the pattern being printed is prone to be misplaced relative to the preset position, thereby deteriorating the positional precision of the bumps.

(12) As already mentioned, when the conductive paste is printed onto a ceramic circuit substrate 31 which has been sintered, the solvent in the conductive paste will spread laterally on the substrate surface to cause "blur" or "slump", and bumps 32 that are finally formed may cause short circuit if their spacing is 100 $\mu$m or less.

Some of these problems can be solved by forming bumps by vapor deposition on a ceramic circuit substrate. However, vapor deposition is not practically feasible for its high cost and a prolonged time required to give the necessary bump thickness.

SUMMARY OF THE INVENTION

It is a general object of the present invention to solve the aforementioned problems associated with the conventional processes for forming fine thick-film conductor patterns by the photolithographic technology.

The present invention generally relates to a process for forming a fine thick-film conductor pattern on a ceramic substrate using a positive-working photoresist, comprising the following steps (A)–(G):

(A) forming a positive-working photoresist layer on the ceramic substrate;

(B) forming grooves arranged in a predetermined fine pattern in the photoresist layer by exposing the positive-working photoresist layer to radiation through a photomask followed by development;

(C) filling the grooves formed in the photoresist layer with a conductive paste which comprises a conductor component, a binder, and a solvent by squeezing the paste into the grooves using a squeegee;

(D) drying the conductive paste in the grooves;

(E) subjecting the grooved positive-working photoresist layer to blanket exposure after step (B), (C) or (D);

(F) removing the positive-working photoresist layer by treatment with a developing solution while leaving a fine thick-film pattern of the dried conductive paste on the ceramic substrate; and (G) firing the substrate to sinter the conductor component in the conductive paste and form a fine thick-film conductor pattern bonded to the ceramic substrate.

The blanket exposure step (E) may be performed at any stage after the formation of grooves in the positive-working photoresist layer and before it is removed with a developing solution.

An object of the present invention is to improve the process so as to eliminate the above-described problems (1) to (3).

According to an embodiment of the invention, this object can be achieved by filling the conductive paste in step (C) by using a mask such as a screen mask having openings with a fine pattern of the same configuration as that of the grooves formed in the photoresist layer. Thus, the conductive paste is squeezed into the grooves by the screen printing technique using the mask, i.e., by placing the mask atop the photoresist layer such that the openings of the mask are in alignment with the grooves of the layer.

This method enables the conductive paste to fill the grooves in the photoresist layer without depositing on the top surface of the photoresist layer since the top surface is hidden by the mask.

If the paste is undesirably deposited on the top surface of the photoresist layer, the deposited paste may firmly stick to the photoresist layer because the solvent, especially polar solvent present in the deposited paste will partially dissolve the photoresist layer, thereby preventing complete removal of the photoresist layer in the development step (F). Furthermore, the deposited paste causes the formation of a thin conductor layer between the desired interconnecting lines in the firing step (G), leading to a cause of short circuit. These undesirable phenomenons can be eliminated by performing the step (C) by means of screen printing.

According to another embodiment of the invention, the above-seated object can be attained by using a conductive paste in step (C) in which the solvent component consists essentially of at least one hydrocarbon solvent. Preferably, the hydrocarbon solvent has a boiling point in the range of 200–350° C.

Since the conductive paste is essentially free from any polar solvent, the solvent present in the conductive paste which fills the grooves in the positive-working photoresist does not dissolve the surrounding photoresist layer, thereby preventing the grooves from being deformed by such dissolution and making it possible to form the conductor pattern with high precision. Furthermore, if the conductive paste is undesirably deposited on the top surface of the photoresist layer during the squeezing step (C), the deposited paste is prevented from sticking firmly to the photoresist layer since the solvent in the paste does not dissolve the underlying photoresist layer and this ensures complete removal of the photoresist layer in the development step (F).

According to yet another embodiment of the invention, the above-stated object can be attained by using a squeegee in step (C) that is made of a material having a flexural modulus in the range of 30–200 kgf/mm$^2$. This offers the advantage that even in the case of forming a fine conductor pattern which partly has a width or diameter of no more than 100 $\mu$m and partly has a width or diameter of more than 100 $\mu$m, the conductive paste can be completely filled into the grooves in the photoresist layer without damaging it, thereby enabling the formation of a fine conductor pattern with high surface flatness and of a precise configuration on the ceramic substrate.

Another object of the present invention is to improve the above-described process for forming a fine thick-film conductor pattern so as to eliminate the aforementioned problems (4)–(6).

According to still another embodiment of the invention, this object can be achieved by forming grooves in the photoresist layer in step (B) by means of laser beam machining in which a laser beam is applied to remove selected areas of the photoresist layer by decomposition so as to form grooves in a predetermined pattern. Since photolithographic pattern formation is not utilized in this method, the blanket exposure step (E) which is necessary as a pretreatment for the removal of the positive-working photoresist may be performed before the laser beam machining, i.e., immediately after the photoresist layer-forming step (A). Needless to say, the blanket exposure step (E) may be performed after the groove forming step (B), or the conductive paste filling step (C), or the conductive paste drying step (D).

In this method where the grooves are formed in the photoresist layer by laser beam machining, the photoresist layer need not be positive-working, but a negative-working photoresist may be employed. When a negative-working photoresist is used, the resulting photoresist layer should not be subjected to any exposure including blanket exposure since it will be no longer removable by a wet process after exposure. The unexposed negative-working photoresist layer can be removed in step (F) by a wet process using a developing solution. In addition, since the photolithographic technology is not employed in this method to form patterned grooves, there is no need of using a photosensitive material for groove formation. Thus, the negative-working photoresist may be replaced by any non-photosensitive soluble resin that can be dissolved in solvents or solutions such as developing solutions (e.g., alkaline or acidic aqueous solutions) without damage to the conductive paste.

According to this embodiment of the invention which utilizes laser beam machining to form grooves, there is no need to use a photomask. As a result, compared to the formation of grooves by the photolithographic technology, a fine pattern of grooves can be formed with a smaller width or diameter and a smaller spacing. Therefore, it is possible to form a fine thick-film pattern of high precision at a relatively low cost such that the spacing between interconnecting lines is no more than 25 $\mu$m and yet a large current can be passed therethrough.

Yet another object of the invention is to improve a process which comprises the steps of forming a pattern of a conductive paste on a ceramic green sheet by the photolithographic technology and co-firing the green sheet and the conductive paste thereon to form a fine thick-film conductor pattern on a sintered ceramic substrate such that the aforementioned problems (7)–(9) are eliminated.

According to a further embodiment of the invention, this object can be achieved by a process which comprises:

forming a positive-working photoresist layer on a support film;

subjecting the support film to the above-described steps (B)–(F), thereby forming a predetermined fine thick-film pattern of dried conductive paste on one surface of the support film;

transferring the dried conductive paste from the support film onto a ceramic green sheet under pressure; and co-firing the ceramic green sheet and the conductive paste which has been transferred thereon.

This embodiment may be modified to include an additional step of laminating a plurality of ceramic green sheets having transferred conductive paste before the co-firing step in accordance with a green sheet lamination process.

According to this embodiment, since the photoresist layer is not formed on the ceramic green sheet but on the support film such as a plastic film, there is no possibility for the photoresist layer to be dissolved in the solvent remaining in the green sheet in the groove-forming step nor will the binder present in the green sheet dissolve in a developing solution during development. As a result, the deformation or distortion of the patterned grooves and the green sheet can be effectively eliminated to ensure the formation of a fine thick-film conductor pattern with high precision by the green sheet lamination process.

In addition, the filling with the conductive paste is also performed on the support film and there is no possibility for the conductive paste to deposit on the ceramic green sheet. As a result, the ceramic circuit substrate obtained by the firing step is effectively protected against short circuit caused by the undesirable deposition of the conductive paste.

Furthermore, since the pattern of the dried conductive paste formed on the support film is transferred to the ceramic green sheet under pressure, the conductive paste pattern is embedded in the green sheet so as to make flat the surface of the green sheet after transfer. As a result, when a plurality of such green sheets each having a transferred conductive paste pattern are laminated according to the green sheet lamination process, the resulting laminate is free from distortion of the individual green sheets, and it is possible to produce a multilayer ceramic circuit substrate having a fine interconnecting pattern of high precision and being free from defects such as short circuit, delamination, warpage, and connection failure.

Still another object of the invention is to provide a process for forming bumps using a conductive paste on a ceramic or glass circuit substrate which is to be bonded by the flip-chip process such that the aforementioned problems (10)–(12) will be eliminated.

This object of the invention can be achieved by forming the bumps on a ceramic or glass circuit substrate generally in accordance with the above-described process for the formation of a conductor pattern which comprises the above-described steps (A)–(G).

This approach eliminates the formation of unevenly high, irregularly shaped and misplaced bumps that has been encountered in the conventional methods of forming bumps by screen-printing with a conductive paste, and makes it possible to form bumps having a uniform height, an accurate shape, and a very high positional precision at a fairly low cost.

In addition, the solvent in the conductive paste is prevented from spreading laterally to cause "blur" or "slump" which may cause a short circuit between bumps and, hence, the pitch between bumps can be sufficiently reduced to increase the packaging density of IC chips attainable by the flip-chip process.

After the conductor pattern has been formed, the positive-working photoresist layer is removed by a wet process rather than firing. Therefore, the substrate and the conductive material will not be thermally or oxidatively damaged.

DETAILED DESCRIPTION OF THE INVENTION

The present invention generally relates to improvements of a process for forming a fine thick-film conductor pattern on a ceramic substrate using a positive-working photoresist, which comprises the following steps (A) to (G):

(A) forming a positive-working photoresist layer on the ceramic substrate;

(B) forming grooves arranged in a predetermined fine pattern in the photoresist layer by exposing the positive-working photoresist layer to radiation through a photomask followed by development;

(C) filling the grooves formed in the photoresist layer with a conductive paste which comprises a conductor component, a binder, and a solvent by squeezing the paste into the grooves using a squeegee;

(D) drying the conductive paste in the grooves;

(E) subjecting the grooved positive-working photoresist layer to blanket exposure after step (B), (C) or (D);

(F) removing the positive-working photoresist layer by treatment with a developing solution while leaving a fine thick-film pattern of the dried conductive paste on the ceramic substrate; and (G) firing the substrate to sinter the conductor component in the conductor paste and form a fine thick-film conductor pattern bonded to the ceramic substrate.

The general process comprising the basic steps (A)–(G) will now be described with reference to FIGS. 1a–1g.

Figure 1:
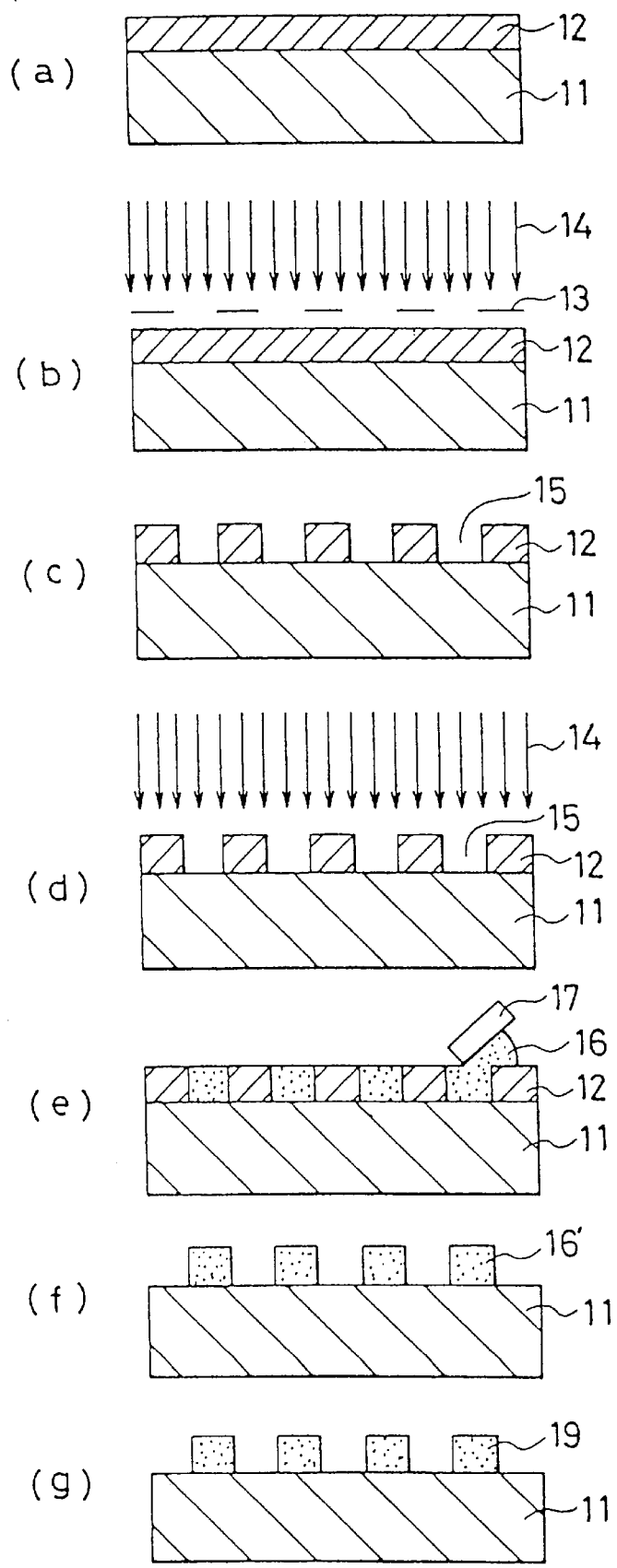
FIGS. 1a–1g schematically show the steps of the general process for forming a fine thick-film conductor pattern which is utilized in accordance with the present invention.

In step (A), a ceramic substrate 11 is overlaid with a positive-working photoresist layer 12 (FIG. 1a). A positive-working photoresist contains such a photosensitive ingredient that upon exposure to radiation, it is decomposed to render the photoresist soluble in a developing solution. Therefore, the exposed area of the photoresist is removed by subsequent development. The developing solution is typically an aqueous alkaline solution.

The ceramic substrate 11 to be used in the invention is not critical. The most common ceramic substrate is an alumina substrate, but various other ceramic substrates including a mullite substrate, a glass-ceramic substrate, and an aluminum nitride substrate may be employed. The ceramic substrate may have one or more internal interconnecting (metallized) layers.

The method of forming the positive-working photoresist layer 12 is also not critical. It may be formed by applying a film-type positive-working photoresist to the ceramic substrate 11. Preferably, the photoresist layer 12 is formed by use of a liquid-type positive-working photoresist. The liquid photoresist may be applied to the ceramic substrate 11 by a suitable coating technique such as roll coating, bar coating, spin coating, or dip coating, and the applied coating is dried by heating, for example, in an oven at 85–95° C. for about 5–40 min. The use of the liquid photoresist has the advantage that even if the surface of the ceramic substrate 11 is irregular on the micron order, the photoresist layer 12 being formed is not significantly affected by such surface irregularity and will have a sufficiently high degree of surface flatness to ensure that the eventually formed fine thick-film conductor pattern also has a flat surface.

Useful liquid positive-working photoresist compositions are commercially available under various trade names including AZ4903 and AZ3620 from Hoechst Japan Ltd., OP RESIST from Tokyo Ohka Kogyo Co., Ltd., ACUTOLACE from Tokyo Electron Ltd., and PROBIMER from Japan-Ciba-Geigy Co., Ltd.

The thickness of the positive-working photoresist layer 12, which determines the height of the eventually formed conductor pattern, is preferably in the range of from 10 to 50 $\mu$m, more preferably from 20 to 30 $\mu$m. If the thickness of the photoresist layer 12 is less than 10 $\mu$m, difficulty will be encountered in a subsequent step of filling grooves 15 formed in the photoresist layer 12 with a conductive paste 16. On the other hand, if the thickness of the photoresist layer 12 exceeds 50 $\mu$m, it is difficult for the development stage to completely remove the exposed area of the photoresist layer to form a fine pattern of grooves 15. Roll coating or bar coating is suitable to form a photoresist layer 12 having a thickness in the above-described range from a liquid positive-working photoresist.

In the next step (B), the positive-working photoresist layer 12 is exposed to radiation, typically UV light 14, through a photomask 13 having a pattern corresponding to the predetermined fine conductor pattern to be formed on the ceramic substrate (FIG. 1b). Thereafter, the photoresist layer is subjected to development with a developing solution so as to remove the exposed area of the photoresist layer, thereby forming grooves 15 in the photoresist layer 12 in a pattern corresponding to the predetermined fine conductor pattern (FIG. 1c). Although other radiation such as an electron beam may be employed for exposure, UV light is most commonly used, so the radiation used for exposure is hereinafter referred to as UV light. The exposed photoresist that remains in the grooves 15 due to poor development, if any, can be removed by dry etching techniques such as plasma ashing.

The conditions for exposure may be the same as those which are commonly employed for this purpose. The exposure energy of UV light is preferably in the range of from 700 to 1,000 mJ/cm$^2$. With insufficient exposure, it is difficult to form grooves by development such that they completely penetrate the photoresist layer to reach the surface of the ceramic substrate. If the exposure energy is excessive, grooves of an inverted trapezoidal profile may form by development.

The developing solution is selected depending on the particular positive-working photoresist used; typically, it is an aqueous alkaline solution. The developing solution may be used in a conventional manner, for example, by spraying or immersion with shaking. In order to ensure that the grooves formed in the photoresist layer by development are prevented from being deformed during subsequent filling with the conductive paste by squeezing, the developed photoresist may be heated to increase its toughness. The heating conditions may be the same as those employed when the wet coating of the liquid photoresist is dried. Alternatively, a higher temperature in the range of 100–140° C. may be employed in order to reduce the heating time.

The above-described method makes it possible to form grooves 15 in the positive-working photoresist layer 12 such that they have a width or diameter in the range of about 30–50 $\mu$m with the spacing between adjacent grooves being as small as 25–50 $\mu$m.

In the illustrated case, the groove-forming step (B) is followed by the blanket exposure step (E) in which the entire surface of the positive-working photoresist layer 12 having the grooves 15 formed thereon is exposed to UV light (FIG. 1d). As already mentioned, the blanket exposing step (E) may be performed subsequent to the conductive paste filling step (C) or the conductive paste drying step (D).

The purpose of performing blanket exposure on the positive-working photoresist layer 12 is to render the photoresist layer soluble in a developing solution so as to remove it in a subsequent step by a wet process. The conditions for the blanket exposure are not critical and the exposure energy may be the same as employed in the imagewise exposure to form the grooves in step (B).

In the next step (C), the grooves 15 formed in the positive-working photoresist layer 12 are filled with a conductive paste 16 by squeezing with a squeegee 17 (FIG. 1e).

The conductive paste is a paste-like composition comprising a conductor component (metal powder), a binder, and a solvent. The binder is normally an organic resin and it is usually dissolved in the solvent which is normally an organic solvent. The conductive component is uniformly distributed in the resulting binder solution by a conventional means such as a three-roll mill to prepare the conductive paste.

The conductor component in the conductive paste may be of any metallic material that is commonly used in the metallization of ceramic substrates. Suitable metallic materials include W, Mo-Mn, Au, Ag, Ag-Pd, and Cu. Since the photoresist layer 12 in which the grooves have been formed and filled with the conductive paste is positive-working and can be removed by a wet process after blanket exposure rather than by burning out in an oxidizing atmosphere, inexpensive metallic materials such as Cu which has a low resistivity but is susceptible to oxidation can be used in the paste, thereby reducing the costs of the ceramic circuit substrate.

As will be described below in detail, the solvent in the conductive paste 16 preferably consists essentially of one or more hydrocarbons. The binder resin should be one that will not dissolve in the developing solution which is to be employed in the subsequent step for removing the positive-working photoresist layer 12. If the resin in the conductive paste dissolves in the developing solution during removal of the photoresist layer, the conductive paste having the predetermined pattern cannot retain its shape and will be deformed. Since the developing solution for the positive-working photoresist is typically an aqueous alkaline solution, the binder in the conductive paste 16 is a resin insoluble in aqueous alkaline solutions. Specific examples of such a resin include ethyl cellulose and acrylate resins including methacrylate resins.

The conductive paste 16 for use in the invention preferably has a composition of 80–96 wt % of the conductor component, 2–6 wt % of the binder, and 2–18 wt % of the solvent. In order to provide the conductive paste with improved adhesion to the ceramic substrate 1, the conductive paste may incorporate 1–10 wt % of an inorganic powder such as a glass, ceramic, silica or titanium oxide powder.

The conductive paste 16 is squeezed into the grooves 15 formed in the photoresist layer 12 using a squeegee 17 of a suitable material so as to fill the grooves, as illustrated in FIG. 1e. The squeegee 17 holds the conductive paste 16 and is moved in one direction while it is in contact with the top surface of the photoresist layer 12. If a portion of the squeezed conducive paste 16 is undesirably deposited on the top surface of the photoresist layer 12, it can be removed by scraping with a clean squeegee 17 which is free from the condutive paste 16. If a very thin layer of the conductive paste 16 still remains on the photoresist layer 12 after the scraping, it may be removed by polishing with a lapping film, e.g., one having abrasive alumina grains of about 1 µm diameter bonded thereon following drying the paste. If the grooves are not completely filled with the conductive paste, squeezing of the paste may be repeated by moving the squeegee in a direction perpendicular to the initial direction to ensure complete filling of the grooves with the conductive paste.

In the next step (D), the conductive paste 16 in the grooves 15 of the photoresist layer 12 is dried by heating so that the solvent in the paste is removed and the resulting dried conductive paste (comprising predominantly the conductor component or metal powder and the binder resin) adhere to the ceramic substrate 11 by the binding action of the resin. For this purpose, heating may be performed at 70–95° C. for about 5–20 min, although other heating conditions may be employed.

As already mentioned, step (E) is a blanket exposure step and it may be performed after any of the steps (B), (C), and (D).

Subsequently, in step (F), the positive-working photoresist layer 12 which has the grooves 15 filled with the dried conductive paste is removed by treatment with a developing solution. Since the positive-working photoresist layer 12 has been rendered soluble in the developing solution by blanket exposure in step (E), it is readily dissolved away in the developing solution. As a result, only the conductive paste 16' is left on the ceramic substrate 11 in the form of the predetermined fine thick-film pattern (FIG. 1*f*).

If the removal of the photoresist layer 12 is performed by burning out in an oxidizing atmosphere, since the amount to be burnt out is so large that oxidation-susceptible inexpensive metallic materials such as Cu or Mo—Mn cannot be used in the conductive paste. Furthermore, the ceramic substrate will be thermally and oxidatively damaged during burning. The use of a wet process to remove the photoresist layer makes it possible to use the above-mentioned inexpensive metallic materials in the conductive paste while avoiding the damage to the ceramic substrate.

In the last step (G), the substrate is subjected to firing to remove the binder and other organic component, if any, remaining in the conductive paste 16 by decomposition and sinter the conductor component in the paste 16 on the ceramic substrate, thereby resulting in the formation of a fine thick-film conductor pattern 19 bonded to the ceramic substrate 11 (FIG. 1*g*).

The firing conditions depend on the particular ceramic substrate 11 and the conductor component and should be selected in such a way that the organic substances remaining in the conductive paste 16 are disappear substantially completely while the conductor component is sintered to become firmly bonded to the ceramic substrate without thermal or oxidative damage to the substrate. It should be noted that since the amount of the organic substances present in the conductive paste 16 is much smaller than that in the photoresist layer 12, the firing step can be performed by heating in an inert or reducing atmosphere, e.g., in a nitrogen gas or in a mixture of nitrogen and hydrogen gases, whereby the organic substances present in the conductive paste can be removed substantially completely by decomposition. Therefore, when the conductor component is formed of an oxidation-susceptible metal such as Cu or Mo—Mn, it is preferred to perform firing in such a non-oxidizing atmosphere.

The fine thick-film conductor pattern 19 formed on the ceramic substrate 11 may optionally be overlaid, for example, by plating with Ni and Au or vapor-deposition of Cr or Cu.

In one form of the improvement according to the invention, the step (C) is performed such that the conductive paste is squeezed into the grooves in the photoresist layer using a mask having openings with a fine pattern of the same configuration as the grooves, i.e., by means of the screen printing technique.

Figure 2:
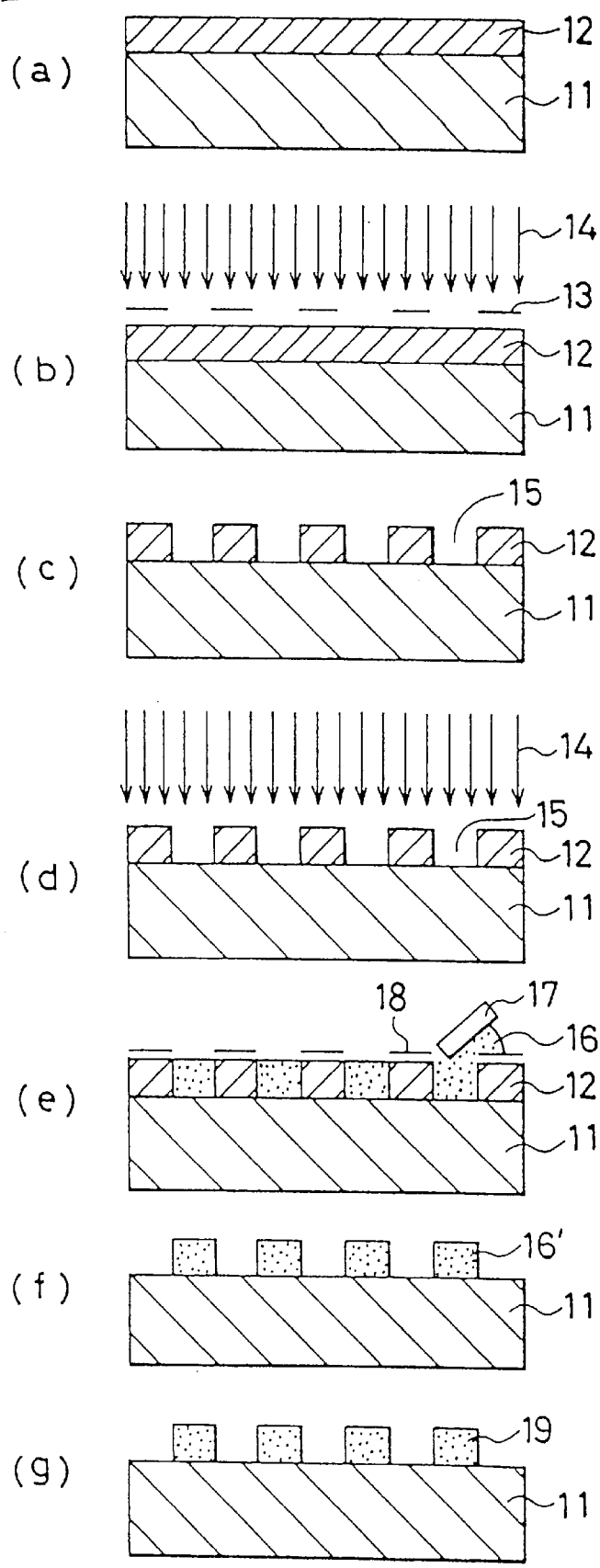
FIGS. 2a–2g schematically show the steps of forming a fine thick-film conductor pattern according to an embodiment of the invention.

This embodiment of the invention will now be described with reference to FIGS. 2*a*–2*g*. All steps of the process shown in FIG. 2 except step (C) may be performed in the same manner as described above. In brief, the ceramic substrate 11 is overlaid with the positive-working photoresist layer 12 (FIG. 2*a*), which is exposed imagewise to UV light 14 through the photomask 13 having a predetermined fine pattern (FIG. 2*b*), developed to form the grooves 15 in the photoresist layer 12 (FIG. 2*c*), and subjected to blanket exposure to UV light 14 (FIG. 2*d*).

In the next step (C) to fill the grooves 15 with the conductive paste 16 by squeezing with a squeegee 17, a mask 18 such as a screen (mesh) mask having openings with a fine pattern of the same configuration as that of the grooves 15 formed in the photoresist layer 12 is used so as to perform the squeezing in the same manner as screen printing (FIG. 2*e*).

The mask may be of the same structure as used in screen printing with a conductive paste. The pattern of the grooves 15 formed in the photoresist layer has essentially the same configuration as the pattern in the photomask 13 used for imagewise exposure, but the two patterns may not be in complete agreement since side etching of the photoresist layer with developing solution may occur during development.

In order to fill the grooves 15 with the conductive paste 16 by use of the mask 18, the mask is placed atop the photoresist layer 12 and in intimate contact therewith in such a way that the openings of the mask 18 are in alignment with the grooves 15 and, after it is fixed in position by a suitable means, the squeegee 17 holding the conductive paste 16 is moved across the mask 18 such that the conductive paste 16 is squeezed into the grooves 15 of the photoresist layer 12 through the openings of the mask 18. When the mask 18 is a screen mask, it is typically made of stainless steel or a polyester resin.

Registration (alignment) between the mask 18 and the grooves 15 in the photoresist layer 12 can be achieved by means of a conventional image identifying apparatus equipped with a CCD camera, a monitor, and a zoom lens system.

By using the mask 18 to fill the grooves 15 in the photoresist layer 12 with the conductive paste 16 through the openings of the mask, the conductive paste 16 can be prevented from depositing on the top surface of the photoresist layer 12. Therefore, if the conductive paste used for filling contains a polar solvent, the photoresist layer is not adversely affected by the solvent in the conductive paste deposited thereon. Furthermore, removal of the conductive paste deposited on the top surface of the photoresist layer by scraping with a clean squeegee and/or by polishing with a lapping film is eliminated, which ensures that the top surface of the filled conductive paste is kept flat. Moreover, after the fine thick-film conductor pattern 19 is finally formed by firing, the occurrence of short circuit between interconnecting lines can be prevented, thereby improving the reliability of the resulting ceramic circuit substrate.

After the grooves 15 in the photoresist layer 12 have been filled with the conductive paste 16 using the squeegee 17 and the mask 18, the procedure already described above will follow: the substrate is heated to a suitable temperature such that the conductive paste is dried with the dried conductive paste adhering to the ceramic substrate 11, and the photoresist layer 12 is then removed by treatment with a developing solution to leave the predetermined fine thick-film pattern of the dried conductive paste 16' on the ceramic substrate 11 (FIG. 2f). Thereafter, the conductive paste 16 is fired to form the fine thick-film conductor pattern 19 on the ceramic substrate 11 (FIG. 2g).

In another form of the improvement according to the invention, the solvent in the conductive paste to be used in filling the grooves in the photoresist layer in step (C) consists essentially of one or more hydrocarbon solvents.

Conventional conductive pastes usually contain a polar solvent such as terpineol, dibutyl carbitol, dibutyl phthalate, butyl carbitol acetate, hexanol, 2,2,4-trimethylpentanediol-1,3-monoisobutyrate, and the like. These alcoholic or ester polar solvents are used due to their high dissolving power for the cellulosic, acrylate, methacrylate, and other resins that are normally used as a binder in the conductive paste.

However, when the grooves in the positive-working photoresist layer are filled with the conductive paste containing such a polar solvent in step (C), the solvent in the filled conductive paste may dissolve the surrounding photoresist layer and causes the conductive paste to stick to the layer. As a result, the shape of the grooves formed in the photoresist layer may be deformed, or the photoresist in the area to which the conductive paste sticks becomes difficult to remove in the photoresist removing step (F), thereby adversely affecting the conductivity of the formed interconnecting pattern due to the residual photoresist. Furthermore, if the conductive paste is undesirably deposited on the top surface of the photoresist layer, short circuit may occur due to the deposited conductive layer as described previously.

It has been found that a hydrocarbon solvent can dissolve the binder resin normally used in the conductive paste to form a conductive paste, but does not dissolve the positive-working photoresist. Therefore, the use of a hydrocarbon solvent in the conductive paste eliminates the above-mentioned difficulties, thereby forming a fine interconnecting pattern of high precision while protecting it against short circuit.

Examples of useful hydrocarbon solvents include toluene, xylene, camphor oil, turpentine oil, pine oil, phenylcyclohexane, bicyclohexyl, dodecylbenzene, pentylbenzene, dipentylbenzene, tetralin, and dodecane. Since these solvents have a low polarity, they do not readily dissolve a positive-working photoresist which is a polar substance, but has a sufficient dissolving power for the binder resin to the used in the conductive paste due to its relatively low polarity and can be used to prepare a conductive paste.

The hydrocarbon solvent preferably has a boiling point in the range of 200–350° C. since it affords a drying speed suitable for easy handling. Hydrocarbon solvents boiling below 200° C. will evaporate so fast during handling of the conductive paste that the viscosity of the paste increases rapidly to such a degree that interferes with the filling operation. Hydrocarbon solvents boiling above 350° C. make it difficult to dry the conductive paste filled into the grooves of the photoresist layer in a short time. Hydrocarbon solvents boiling at 200–350° C. include phenylcyclohexane, bicyclohexyl, dodecylbenzene, pentylbenzene, dipentylbenzene, tetralin, and dodecane. A more preferred boiling point range is 200–250° C.

In yet another form of the improvement according to the invention, the squeegee to be used in the conductive paste filling step (C) is made of a material having a flexural modulus of 30–200 kgf/mm$^2$, preferably 50–150 kgf/mm$^2$. The flexural modulus refers to the value as measured in accordance with the test method specified in ASTM D790.

The squeegee to be used in filling with the conductive paste is normally a flat plate which usually has a thickness of about 1–5 mm, a length of about 50–100 mm, and a width of about 10–50 mm. The plate may have a tapered edge in the distal end portion which will come into contact with the surface of the photoresist layer.

A rubber-made squeegee has conventionally been used. However, such a flexible squeegee that has a flexural modulus of less than 30 kgf/mm$^2$, when used to squeeze the conductive paste into large grooves having a width or diameter in excess of 100 $\mu$m, will become flexed and get deep into the grooves to scrape out the conductive paste that has been filled into the grooves. As a result, the eventually formed conductor pattern will not have the desired precise pattern shape or its height will fluctuate irregularly.

On the other hand, if a hard squeegee is used which has a flexural modulus in excess of 200 kgf/mm$^2$, the thickness of the squeezed conductive paste undesirably deposited on the top surface of the surfaces of the photoresist layer is increased to form a relatively thick layer of the paste on that surface, and the occurrence of short circuit between the interconnecting lines due to the deposited conductive paste will become severe. In addition, if the hard squeegee is strongly depressed against the surface of the photoresist layer so as to reduce the amount of the paste deposited on the top surface of the photoresist layer, the photoresist layer will be injured by the squeegee to form surface flaws or defects on the photoresist layer and preclude the formation of the desired fine conductor pattern with high precision.

In contrast, when the flexural modulus of the squeegee is within the range of 30–200 kgf/mm$^2$, even large grooves can effectively be filled with the conductive paste without damage to the photoresist layer and, in addition, only a minimal amount of the conductive paste will remain on the surface of the photoresist layer. Besides having a flexural modulus in the range of 30–200 kfg/mm$^2$, the material for the squeegee should have good chemical resistance such that it does not dissolve in the solvent present in the conductive paste.

Examples of such a material useful for the squeegee include fluoroplastic resins such as perfluoroalkoxy resins, tetrafluoroethylene resins, ethylene-propylene fluoride resins, tetrafluoroethylene-ethylene copolymer resins, polyvinylidene fluoride resins, and polychlorotrifluoro-ethylene resins. Of these, tetrafluoroethylene resins (known as the trade name "TEFLON"$^{RT}$) are preferred since they are most readily available and inexpensive. Silicone resins are also useful as a material for the squeegee.

In still another form of the improvement according to the invention, the formation of the grooves in the positive-working photoresist layer in step (B) is performed by laser beam machining in place of the photolithographic technique. In this embodiment, the blanket exposing step (E) may be performed prior to the laser beam machining step. In addition, the positive-working photoresist layer may be replaced by a negative-working photoresist layer or even by a soluble resin layer. In such cases, the blanket exposure step should be omitted.

Thus, according to this embodiment, a fine thick-film conductor pattern can be formed on a ceramic substrate by either the following process (I) or (II).

Process (I) uses a positive-working photoresist and comprises the steps of:

(A) forming a positive-working photoresist layer on the ceramic substrate;

(B') forming grooves arranged in a predetermined fine pattern in the photoresist layer by application of a laser beam to the layer;

(C) filling the grooves formed in the photoresist layer with a conductive paste which comprises a conductor component, a binder, and a solvent by squeezing the paste into the grooves using a squeegee;

(D) drying the conductive paste in the grooves;

(E) subjecting the grooved positive-working photoresist layer to blanket exposure after step (A), (B), (C) or (D);

(F) removing the positive-working photoresist layer by treatment with a developing solution while leaving a fine thick-film pattern of the dried conductive paste on the ceramic substrate; and (G) firing the substrate to sinter the conductor component in the conductive paste and form a fine thick-film conductor pattern bonded to the ceramic substrate.

Process (II) uses a soluble resin in place of the positive-working photoresist and comprises the steps of:

(A') forming a layer of a soluble resin on the ceramic substrate;

(B') forming grooves arranged in a predetermined fine pattern in the soluble resin layer by application of a laser beam to the layer;

(C) filling the grooves formed in the resin layer with a conductive paste which comprises a conductor component, a binder, and a solvent by squeezing the paste into the grooves using a squeegee;

(D) drying the conductive paste in the grooves;

(F') removing the resin layer by dissolution while leaving a fine thick-film pattern of the dried conductive paste on the ceramic substrate; and (G) firing the substrate to sinter the conductor component in the conductive paste and form a fine thick-film conductor pattern bonded to the ceramic substrate.

The soluble resin layer to be formed in process (II) is preferably a negative-working photoresist layer, so it is hereinafter referred to as a negative-working photoresist layer.

In both processes (I) and (II), a laser beam is used to form grooves in the photoresist layer and, hence, compared to the formation of the grooves by the photolithographic technique, the shape and width of the grooves can be controlled more precisely, thereby making it possible to form a fine pattern of the grooves having an even finer width with a smaller spacing. As a result, a fine thick-film conductor pattern having a line width of about 10–25 $\mu$m with a line spacing as small as 15 $\mu$m which allows a large current flow to pass therethrough can be formed with high precision at a relatively low cost.

Process (I) will now be described with reference to FIGS. 3a–3f. All the steps of this method except step (B') can be performed in the same manner as in the basic general process described above. In step (C) for filling the grooves with the conductive paste, any of the forms of the above-described improvement according to the invention may be applied.

Figure 3:
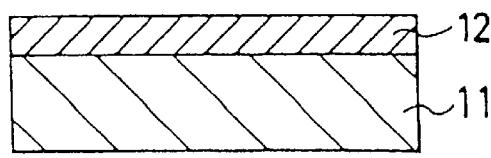
FIGS. 3a–3f schematically show the steps of forming a fine thick-film conductor pattern according to another embodiment of the invention.
Figure 3:
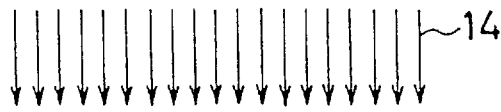
Figure 3:
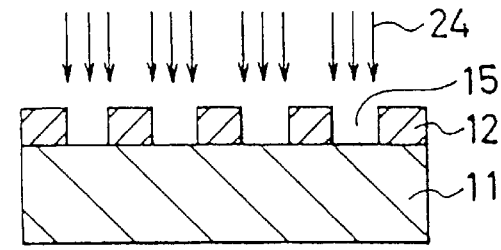
Figure 3:
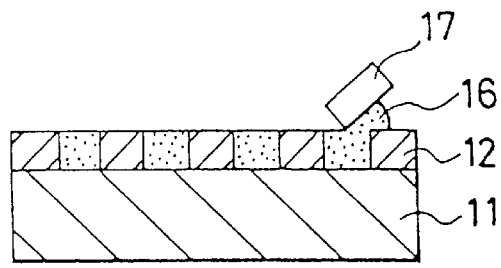
Figure 3:
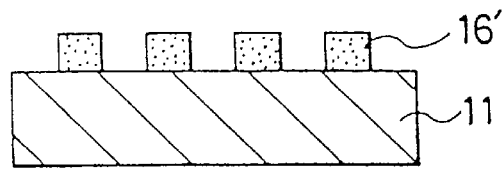
Figure 3:
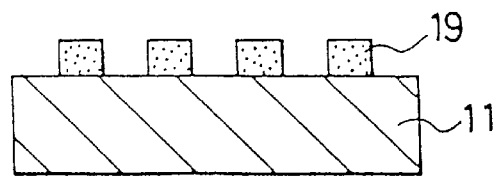

The process (I) starts with step (A) in which the ceramic substrate 11 is overlaid with the positive-working photoresist 12 (FIG. 3a).

Thereafter, in the illustrated case, the blanket exposure step (E) is performed by exposing the entire surface of the positive-working photoresist layer 12 to UV light 14 so as to render the layer soluble in a developing solution (FIG. 3b). As already mentioned, the blanket exposing step (E) may be performed after the groove forming step (B), conductive paste filling step (C), or conductive paste drying step (D).

In the next step (B'), grooves are formed in the photoresist layer to form a fine pattern of grooves that corresponds to a predetermined fine thick-film conductor pattern. In this process, a laser beam machining technique is employed to form the grooves 15 in the photoresist layer 12 by applying the laser beam 24 to those areas of the photoresist layer 12 that are to be removed (FIG. 3c).

Application of the laser beam 24 is performed by scanning over the surface of the photoresist layer 12 in such a manner that the grooves 15 are formed in a pattern corresponding to the fine thick-film conductor pattern to be formed on the ceramic substrate. By adjusting the intensity of the laser beam 24 within an appropriate range, only the areas of the photoresist layer 12 to which the laser beam is applied can be completely decomposed away without damaging the underlying ceramic substrate 11.

The conditions under which the laser beam 24 is applied vary depending on various factors including the material and thickness of the photoresist layer 12, and the material of the ceramic substrate 11. When an aluminum substrate is overlaid with a 25 $\mu$m-thick photoresist layer 12, it is preferred to apply the laser beam 24 with an intensity of about 0.5–2 J/cm$^2$ and at a scanning speed of about 1–10 cm/sec. A typical excimer laser has an energy in the range of approximately 100–300 mJ/cm$^2$, although is varies depending on the laser apparatus and the gas used. Therefore, it is desirable to enhance the intensity of the laser beam to 0.5–2 J/cm$^2$ prior to application. This can be achieved by a method known as mask-measured method whereby the laser beam 24 is passed through a photomask several times as large as the pattern to be actually fabricated and then through a lens system which allows the laser beam to be projected on the substrate on a reduced scale.

Scanning with the laser beam 24 usually requires two mirrors, and by employing an ultrasonic switch or the like, pulse control can be accomplished at a high speed to draw a pattern of high precision. The application pattern of the laser beam 24, namely, the moving patterns of the mirrors and other devices can be stored in a computer to draw a predetermined pattern repeatedly on a plurality of the photoresist layers 12 with high reproducibility. Even in the case of forming different interconnecting patterns, such patterns can be drawn simply by changing the moving patterns of the mirrors and other devices, which can be readily performed by a software of the computer, and there is no need to prepare a different photomask for each different interconnecting pattern as is the case in the photolithographic technology. Therefore, the pattern formation by laser beam machining is economically advantageous particularly in the production of many varieties of ceramic circuit substrates in small lots.

During application of the laser beam 24, carbon particles may occasionally be deposited in areas around the processing site, but these particles can be removed by wiping with a solvent such as toluene or xylene or ultrasonic cleaning with such a solvent. Since these hydrocarbon solvents do not dissolve the photoresist, there is no possibility for the laser beam-machined areas to be distorted.

Any laser can be used as long as it generates a laser beam having a sufficient intensity to perform the laser beam machining of the photoresist layer. Suitable lasers include excimer lasers and YAG lasers, of which excimer lasers are preferred.

After the grooves 15 are formed in the positive-working photoresist layer 12 by laser beam machining, they are filled with the conductive paste 16 by means of the squeegee 17 in step (C) (FIG. 3d). Also in this case, any of the aforementioned improvements for step (C) may be adopted.

In the next step (D), the conductive paste in the grooves is dried by heating at such a temperature that the solvent therein is removed and the dried paste adheres to the ceramic substrate 11 by the action of the binder component. Thereafter, in step (F), the photoresist layer 12 is removed by a wet process using a developing solution, thereby leaving the ceramic substrate 11 having thereon a predetermined fine thick-film pattern of the dried conductive paste 16' (FIG. 3e). Then, in step (G), the dried conductive paste is fired to form a fine thick-film conductor pattern 19 on the ceramic substrate 11 (FIG. 3f). Steps (D), (F) and (G) may be performed in the same manner as described above.

Process (II) starts with step (A') in which a layer of a negative-working photoresist (or any other soluble resin) is formed on the ceramic substrate. If a negative-working photoresist is exposed to UV light, it becomes insoluble in a developing solution and cannot be removed after groove formation by laser beam machining. Therefore, in this process, the photoresist layer is not exposed to UV light. Thus, according to Process (II), a fine thick-film conductor pattern 19 can be formed on the ceramic substrate 11 in the same manner as process (I) shown in FIGS. 3a–3f, except for the following three points: a negative-working photoresist is used in step (A') shown in FIG. 3a to form the photoresist layer 12; the blanket exposing step shown in FIG. 3b is omitted; and a developing solution for the negative-working photoresist is used in step (F) to remove the grooved photoresist layer.

Examples of useful negative-working photoresist to be used in process (II) include NOPCOCURE L-1020 and 1520 sold by Sunnopco Co., Ltd. PMER N-HC600 sold by Tokyo Ohka Co., Ltd. Examples of developing solutions for a negative-working photoresist include 1,1,1-trichloroethane, SN-OX2892 sold by Sunnopco Co., Ltd. and PMER N-A5 sold by Tokyo Ohka Kogyo Co., Ltd.

According to another embodiment of the invention, there is provided an improvement of the process for forming a fine thick-film conductor pattern which comprises the steps of forming a conductive paste pattern on a ceramic green sheet by the aforementioned photolithographic technology using a positive-working photoresist and co-firing the green sheet and the conductive paste.

The improvement is accomplished by a process comprising the following steps:

(A") forming a positive-working photoresist layer on the surface of a support film;

(B) forming grooves arranged in a predetermined fine pattern in the photoresist layer by exposing the positive-working photoresist layer to radiation through a photomask followed by development;

(C) filling the grooves formed in the photoresist layer with a conductive paste which comprises a conductor component, a binder, and a solvent by squeezing the paste into the grooves using a squeegee;

(D) drying the conductive paste in the grooves;

(E) subjecting the grooved positive-working photoresist layer to blanket exposure after step (B), (C) or (D);

(F-1) removing the positive-working photoresist layer by treatment with a developing solution while leaving a predetermined fine thick-film pattern of the dried conductive paste on the support film;

(F-2) transferring the dried conductive paste from the support film onto a ceramic green sheet under pressure followed by removal of the support film from the conductive paste; and (G') co-firing the ceramic green sheet and the conductive paste transferred thereto.

The process for forming a fine thick-film conductor pattern according to this embodiment will now be described with reference to FIGS. 4a–4h.

Figure 4:
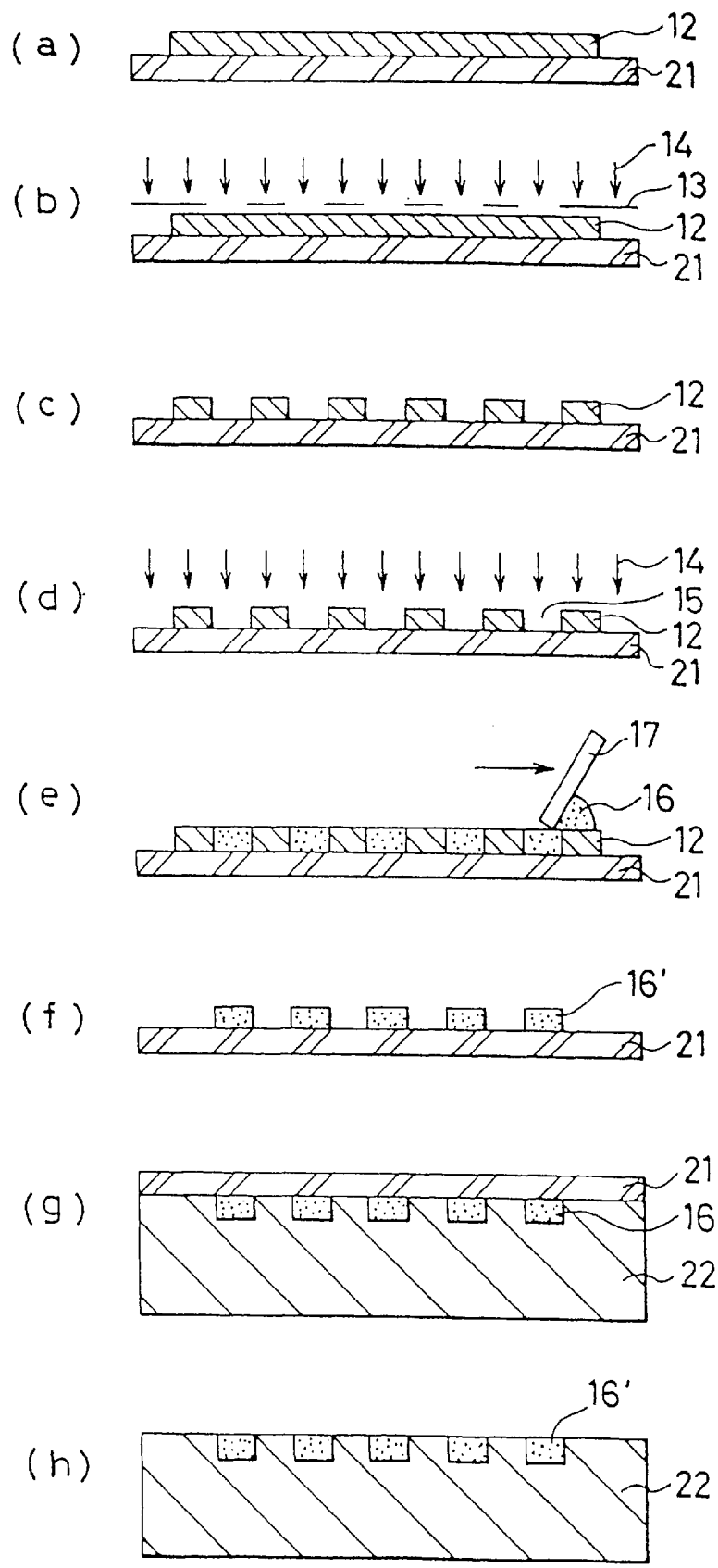
FIGS. 4a–4h schematically show the steps of forming a fine thick-film conductor pattern on a ceramic green sheet according to the invention.
Figure 5:
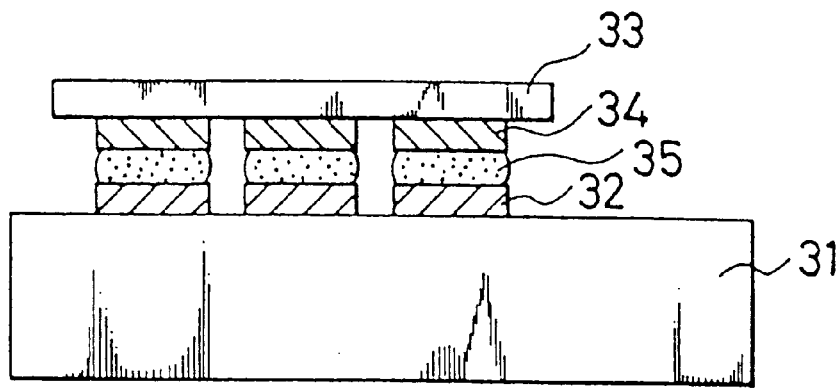
FIG. 5 is a sectional view of an IC chip bonded to a ceramic substrate by the flip-chip process.
Figure 6:
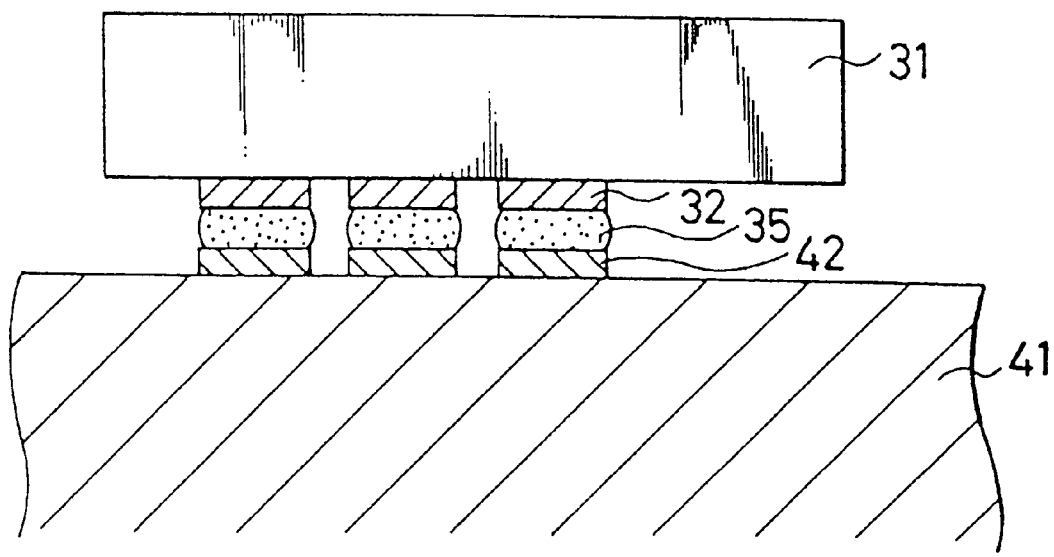
FIG. 6 is a sectional view of a ceramic substrate bonded to a mother board by the flip-chip process.
Figure 7:
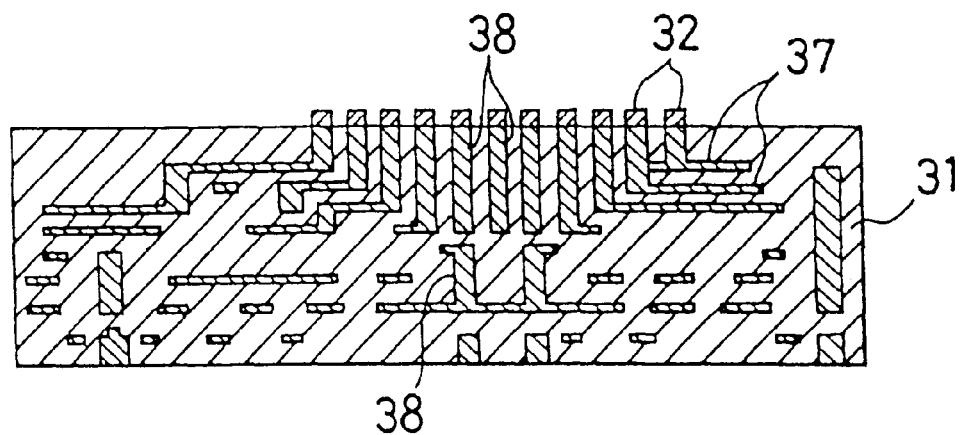
FIG. 7 is a sectional view showing an example of a multilayer ceramic interconnected substrate used to mount an IC chip thereon by the flip-chip process.
Figure 8:
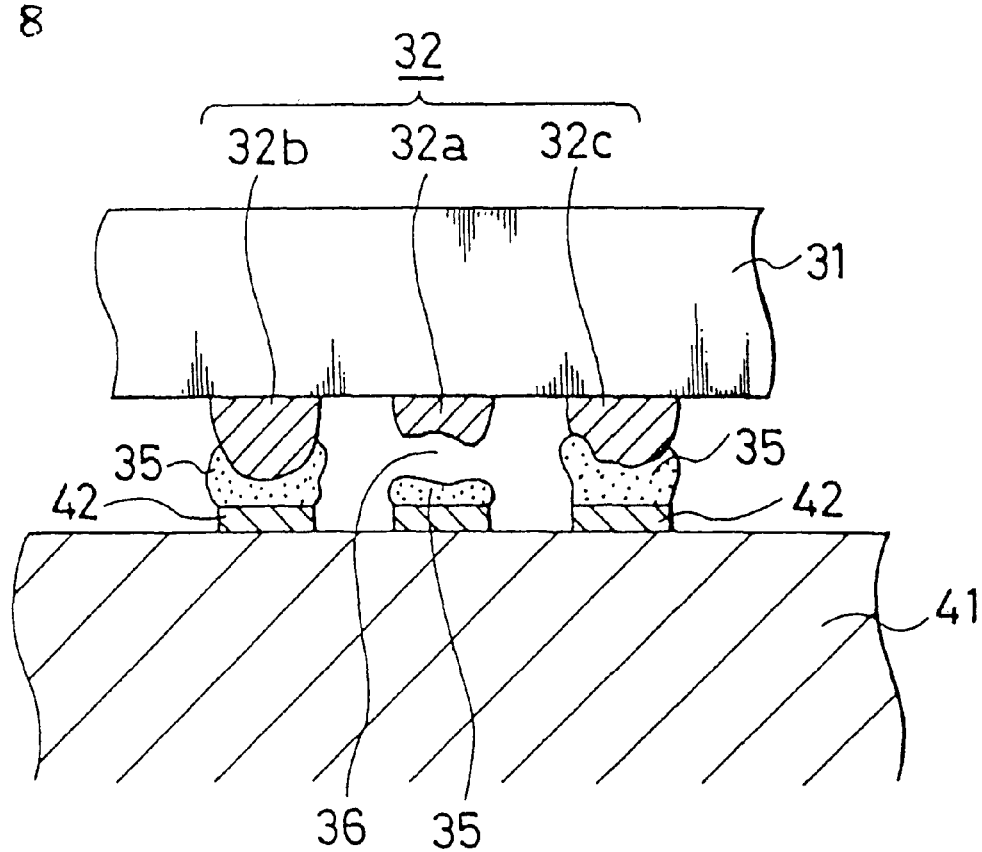
FIG. 8 is a sectional view of bumps formed on a ceramic substrate by screen printing which are connected to bumps on a mother board through a solder.

In the first step (A"), a support film 21 is overlaid with a positive-working photoresist layer 12 (FIG. 4a). This step may be performed in the same manner as described hereinabove, except that the photoresist layer is formed on a support film rather than on a ceramic substrate.

The support film 21 is preferably a flexible plastic film such as a polyester or polyethylene film in order to facilitate removal of the film by peeling in a subsequent step. To further facilitate the removal of the film, the support film 21 may be treated with a release agent such as silicone oil or a release film may be laminated on the support film.

Subsequently, the positive-working photoresist layer 12 on the support film 21 is subjected to the steps of forming grooves, blanket exposure, filling of the grooves with the conductive paste, drying it, and removing the photoresist layer in the same manner described hereinabove, whereby a fine thick-film pattern of the dried conductive paste 16' is formed on the surface of the support film 21.

More specifically, in step (B), the positive-working photoresist layer 12 on the support film 21 is exposed to UV light 14 through the photomask 13 (FIG. 4b) and developed to form grooves 15 in the photoresist layer 12 (FIG. 4c). In the illustrated case, step (B) is followed by step (E), whereby the photoresist layer 12 is subjected to blanket exposure to UV light 14 (FIG. 4d). The blanket exposure may be performed after step (C) or (D).

Subsequently, in step (C), the grooves 15 in the photoresist layer 12 are filled with a conductive paste 16 by squeezing using a squeegee 17 (FIG. 4e). In step (C), any of the aforementioned improvements may optionally be adopted. In the next step (D), the conductive paste 16 filled in the grooves is dried by heating at a temperature sufficient to remove the solvent in the conductive paste and cause the dried paste to adhere to the support film.

Thereafter, in step (F-1), the positive-working photoresist layer 12 is removed by treatment with a developing solution while leaving a predetermined fine thick-film pattern of dried conductive paste 16' on the support film (FIG. 4f).

In the subsequent step (F-2), the fine thick-film pattern of dried conductive paste 16' on the support film 21 is transferred to the ceramic green sheet 22 under pressure (FIG. 4g) and the support film 21 is then stripped off from the conductive paste 16' (FIG. 4h).

In practice, the transfer under pressure is performed by the following manner. First, the support film 21 having the pattern of dried conductive paste 16' thereon is placed over the ceramic green sheet 22 such that the dried conductive paste 16' is in contact with the surface of the green sheet 22. Then, pressure is applied to the ceramic green sheet 22 in the direction of its thickness using a suitable pressing means such as a conventional press. Preferably, a pressing force in the range of about 10–100 kg/cm² is applied for a period of about 1–2 minutes. Optionally, the ceramic green sheet 22 may be heated at around 100° C. in order to enhance the plasticity thereof.

The ceramic green sheet 22 to be used in the invention may be prepared from a slurry comprising a ceramic powder, a sintering additive, a binder, a plasticizer, and a solvent. The ceramic powder may be formed of one or more materials such as alumina, mullite, glass, aluminum nitride, and the like. The binder may be selected from polyvinyl butyral and acrylate resin. Useful solvents include toluene, xylene, and isobutyl alcohol and an example of the plasticizer is dibutyl phthalate (DBP). The slurry is shaped into sheet or tape by a suitable method such as the doctor blade method and then dried to form a ceramic green sheet.

Due to the incorporation of the plasticizer, the ceramic green sheet 22 is relatively soft. On the other hand, the dried conductive paste 16' deposited on the support film 21 does not contain a plasticizer and, hence, is harder than the ceramic green sheet 22. Accordingly, as shown in FIG. 4g, the dried conductive pate 16' being transferred to the ceramic green sheet 22 under pressure gets into the green sheet and is readily embedded therein such that the top surface of the dried conductive paste 16' has the same level as that of the ceramic green sheet 22. Thus, by subsequent removal of the support film 21 from the dried conductive paste, the ceramic green sheet has a substantially flat surface in which the dried conductive paste 16' is completely embedded, as shown in FIG. 4h.

A plurality of the ceramic green sheets 22 each having the dried conductive paste 16' embedded therein by transfer may, prior to firing, be laminated in a conventional manner to form a laminate, as is performed in the green sheet multilayer lamination method to form a multilayer ceramic circuit substrate.

All the plurality of ceramic green sheets to be laminated may not be prepared by the above-described process, but some of them may be prepared by other process which may have a conductive paste pattern raised from the surface of the green sheet, although this is less preferred. The plurality of ceramic green sheets may have the same or different patterns of the dried conductive paste, and some of them may not have a pattern of a dried conductive paste. Each green sheet may have one or more via holes, as required. The laminate may be formed by thermal compression bonding such as hot pressing.

In step (G'), the ceramic green sheet 22 to which the dried conductive paste 16' has been transferred (or a laminate of these green sheets) is fired. Thus, the green sheet and the conductive paste are co-fired simultaneously. During firing, the organic components remaining in the ceramic green sheet and conductive paste (mainly composed of binders) are removed by decomposition, and at the same time, the ceramic powder in the green sheet and the conductor component in the conductive paste are sintered, resulting in the formation of a ceramic circuit substrate having a metallization (interconnecting) pattern on the surface. Firing of the above-described laminate results in the formation of a multilayer ceramic circuit substrate having one or more internal interconnecting layers in addition to the surface interconnecting pattern.

The firing conditions (temperature, atmosphere, etc.) vary depending on the ceramic and conductor components, and should be selected such that the organic components can be completely decomposed away while ensuring that the ceramic powder and the conductor component are fully sintered without oxidation of the conductor metal. If the conductor component is susceptible to oxidation as is the case with Cu or Mo—Mn powder, the firing atmosphere should be a non-oxidizing one, e.g., an inert gas atmosphere such as nitrogen or a reducing gas atmosphere such as a mixture of an inert gas, hydrogen, and a slight proportion of water vapor. When the conductor metal is not susceptible to oxidation as is the case with Ag—Pd and other noble metals, the firing atmosphere may be an oxidizing atmosphere such as air.

The ceramic green sheet 22 to be fired in step (G') has a flat surface with the dried conductive paste 16' completely embedded therein. Therefore, the resulting sintered ceramic circuit substrate also has a flat surface with no protrusion of the interconnecting pattern, which facilitates bonding of an electronic device thereto.

In the case of fabricating a multilayer ceramic circuit substrate using a laminate of green sheets, there are provided the following additional advantages that the green sheets are not distorted in the laminating step and that the occurrence of delamination, warpage, and other defects including internal defects is minimized in the co-firing step since uneven shrinkage due to distortion of the green sheets can be prevented.

Furthermore, since the photoresist layer is formed on the surface of a support film such as a plastic film rather than on the surface of the ceramic green sheet, distortion of the pattern of grooves in the photoresist layer due to dissolution of the photoresist in the solvent slightly remaining in the green sheet as well as distortion of the green sheets due to dissolution of the binder component of the green sheet in a developing solution during development can be avoided. As a result, connection failure due to these distortions can be prevented and the pattern precision of the surface and internal interconnecting lines can be improved, thereby making it possible to fabricate a highly reliable multilayer ceramic circuit substrate.

According to yet another embodiment of the invention, bumps are formed on the surface of a ceramic or glass circuit substrate which is to be bonded to an electronic device such as an IC chip or a mother board by the flip-chip bonding method. The formation of bumps is performed by the aforementioned general process comprising the basic steps (A)–(G) using a positive-working photoresist.

In this embodiment, all the steps (A) to (G) are performed in the same manner as described hereinabove, except that the predetermined fine thick-film conductor pattern to be formed on the substrate is in the form of bumps. The substrate may be either a ceramic or glass circuit substrate, i.e., in which an interconnecting pattern has been formed. The substrate may be a multilayer circuit substrate.

The thickness of the photoresist layer formed in step (A) may be in the range of from 10 to 50 $\mu$m as in the aforementioned formation of a conductor interconnecting pattern. The diameter of bumps to be formed is typically on the order of 90–150 $\mu$m when the bumps are bonded to an IC chip or on the order of 100–200 $\mu$m when they are bonded to a mother board.

Also in the formation of bumps, some of the above-described improvements according to the invention may be employed. Thus, the formation of grooves in the positive-working photoresist layer in step (B) may be performed by laser beam machining rather than the photolithographic technique. In this case, as stated above, the positive-working photoresist layer may be replaced by a negative-working photoresist layer or simply by a soluble resin layer and accordingly the blanket exposure step (E) is omitted. In step (C), any of the above-described improvements including the use of a mask during squeezing, and selection of the solvent and/or the material for the squeegee may be employed.

Compared to the formation of bumps by screen printing, the process of the invention enables the formation of bumps having a more uniform height and a higher shape and positional precision. Furthermore, "blur" and "slump" which have been encountered in the conventional screen printing technique due to spreading of the solvent in the screen-printed conductive paste on the substrate can be minimized and, hence, short-circuit between bumps can be effectively prevented. As a result, the substrate having bumps formed by the process of the invention can be connected to an IC chip or a mother board without the occurrence of connection failure and short circuit.

The following examples are provided for the purpose of further illustrating the present invention but are in no way to be taken as limiting. All the parts are by weight unless otherwise indicated.

EXAMPLES

The following Examples 1–3 illustrate an embodiment of the invention in which a conductive paste is squeezed by the screen printing technique using a mask.

Example 1

An alumina ceramic substrate was bar-coated on its entire surface with a liquid positive-working photoresist (AZ4903 sold by Hoechst Japan Ltd.) to a thickness of 25 $\mu$m and the wet coating was dried in an oven at 90° C. for 30 minutes to form a positive-working photoresist layer on the alumina substrate.

The positive-working photoresist layer was then subjected to imagewise exposure through a photomask to UV light so as to apply any exposure energy of 900 mJ/cm$^2$ to the photoresist layer. The photomask has an interconnecting pattern with a line width of 50 $\mu$m and a line spacing of 100 $\mu$m.

Following the imagewise exposure of the photoresist layer, the ceramic substrate was immersed with shaking in a developing solution (AZ400K sold by Hoechst Japan Ltd. diluted with 4 volumes of water) to develop the photoresist layer, thereby forming grooves in the positive-working photoresist layer in a line pattern corresponding to that of the mask.

The ceramic substrate was then heated on a hot plate at 120° C. for about 30 seconds to strengthen the grooved photoresist layer, which was then subjected to blanket exposure by applying UV light to the entire surface of the photoresist layer to give an exposure energy of 900 mJ/cm$^2$.

Separately, an Mo—Mn based conductive paste was prepared by uniformly dispersing a mixture of 75 parts of a molybdenum powder (average particle diameter=1.0 $\mu$m), 15 parts of a manganese powder (average particle diameter= 2.1 $\mu$m), 5 parts of a titanium oxide powder (average particle diameter=0.5 $\mu$m), and 5 parts of a silica powder (average particle diameter=2.5 $\mu$m) in 23 parts of bicyclohexyl solvent containing 10 wt % of an acrylate resin as a binder.

The conductive paste was used to fill the grooves formed in the positive-working photoresist layer by squeezing it into the grooves using a screen mask made of a stainless steel screen having openings in a pattern of the same configuration as the grooves.

More specifically, the screen mask was placed on the positive-working photoresist layer such that the openings of the mask were in alignment with the grooves formed in the photoresist layer. An appropriate amount of the conductive paste was then placed on one end of the screen mask and squeezed into the grooves through the openings of the screen mask by moving a squeegee made of an urethane rubber across the screen mask.

The conductive paste filled in the grooves was then dried by heating at 90° C. for 10 minutes, thereby causing the dried conductive paste to adhere by the action of the binder component of the paste.

The alumina ceramic substrate was then immersed with shaking in a developing solution (AZ400K sold by Hoechst Japan Ltd. diluted with 4 volumes of water) to dissolve away the positive-working photoresist layer while leaving the dried conductive paste on the substrate.

The ceramic substrate having a pattern of the dried conductive paste was finally fired at 1,500° C. in an $N_2$—$H_2$ mixed gas containing a slight proportion of water vapor, whereby the organic matter in the conductive paste was decomposed away and the metallic powder was sintered to form the desired fine, thick-film, Mo—Mn interconnecting pattern bonded to the alumina ceramic substrate.

The interconnecting pattern was examined with a scanning electron microscope to evaluate for precision and it had a very high precision with a line width of 45±2 $\mu$m. Observation of the interconnecting pattern under an optical microscope revealed that no short circuit was formed between adjacent interconnecting lines.

Example 2

A fine, thick-film, Cu interconnecting pattern was formed on an alumina ceramic substrate in the same manner as described in Example 1, except that the powder components in the conductive paste consisted of 95 parts of a copper powder (average particle size=1.5–2.0 $\mu$m) and 5 parts of a glass powder (average particle size=0.7–1.5 $\mu$m) and that the firing of the substrate in the last step was performed at 900° C. in a nitrogen atmosphere.

The interconnecting pattern formed on the alumina ceramic substrate was found to have a very high precision (line width=45±2 $\mu$m) and to be totally free from short circuit between adjacent interconnecting lines.

Example 3

An alumina ceramic substrate having a surface roughness of ±3 $\mu$m was bar-coated with a liquid positive-working photoresist (AZ4903 of Hoechst Japan Ltd.) to a thickness of about 25 $\mu$m and heated for drying the wet coating under the same conditions as in Example 1 to form a positive-working photoresist layer on the substrate.

The positive-working photoresist layer was then exposed to UV light, which gave an exposure energy of 900 mJ/cm$^2$ to the layer, through a photomask having a predetermined bump pattern (bump diameter=50 $\mu$m; bump-to-bump pitch=100 $\mu$m).

Following the imagewise exposure, the positive-working photoresist layer was developed to form bump-shaped grooves in the photoresist layer and then subjected to heating and blanket exposure in the same manner as described in Example 1.

The resulting grooves in the positive-working photoresist layer were then filled with an Mo—Mn based conductive paste by the same screen printing method as in Example 1 using a screen mask having openings corresponding the bump-shaped grooves. The conductive paste used consisted of 85 wt % of a mixture of powders of Mo, Mn, $SiO_2$, and $TiO_2$ (each having the same average particle diameter as in Example 1) at a weight ratio of 75:15:5:5, 6 wt % of an acrylate resin, and 9 wt % of turpentine oil.

Following filling with the conductive paste, the alumina ceramic substrate and the overlying photoresist layer having conductive paste-filled grooves was processed by drying, removal of the photoresist layer and firing in the same manner as described in Example 1 to form metallic (Mo—Mn) bumps on the surface of the alumina ceramic substrate. The metallic bumps were finally plated with Ni and Au.

Two hundred samples prepared as above were measured for the bump height using a surface profilometer (SURFCOM 112B manufactured by Tokyo Seimitsu Co., Ltd.). All the bumps measured had such a very uniform height that the fluctuation in the bump height was within 1 $\mu$m. In addition, no short circuit was found between bumps by microscopic observation.

The alumina substrate having bumps thereon was used to mount an IC chip by flip-chip bonding between the bumps of the substrate and those of the IC chip. No connection failure was found between the two groups of bumps.

Comparative Example 1

A fine, thick-film, Mo—Mn interconnecting pattern was formed on an alumina ceramic substrate in the same photolithographic manner as described in Example 1, except that filling with the conductive paste was performed in a conventional squeezing manner without using a screen mask.

Thus, an appropriate amount of the Mo—Mn based conductive paste was placed on the positive-working photoresist layer and it was squeezed directly into the grooves of the photoresist layer using a squeegee made of an urethane rubber by moving it across and in contact with the surface of the positive-working photoresist layer.

After this squeezing operation, it was observed that a small part of the squeezed conductive paste was undesirably deposited on the top surface of the photoresist layer. This deposition finally caused short circuit between adjacent interconnecting lines formed on the substrate after the firing step.

Comparative Example 2

A fine, thick film, Mo—Mn interconnecting pattern was formed on an aluminum ceramic substrate by the conventional direct screen-printing technique with a conductive paste without the formation of a photoresist layer to form grooves in a photolithographic manner. The alumina substrate and the conductive paste used in this example were the same as those used in Example 1.

Thus, a stainless steel screen mask similar to that used in Example 1 in the squeezing step and having the same opening pattern was placed directly on the ceramic substrate and the Mo—Mn based conductive paste was screen-printed by squeezing it through the openings of the mask onto the substrate using the same squeegee to form a pattern of the conductive paste on the substrate, which was then fired under the same conditions as in Example 1 to form the desired fine, thick-film interconnecting pattern on the ceramic substrate.

After the screen printing, it was observed that blue or slump of the printed paste occurred on the substrate. The resulting interconnecting pattern had short circuit between adjacent interconnecting lines probably due to the blur or slump of the paste.

The following Examples 4–6 illustrate an embodiment of the invention in which the formation of grooves in the photoresist layer is performed by laser beam machining.

Example 4

An alumina ceramic substrate was bar-coated on the entire surface with a liquid positive-working photoresist (AZ4903 sold by Hoechst Japan Ltd.) to a thickness of 25 $\mu$m and the wet coating was dried in an oven at 90° C. for 30 minutes to form a positive-working photoresist layer.

The positive-working photoresist layer was then subjected to blanket exposure by application of UV light to the entire surface of the layer to give an exposure energy of 800 $mJ/cm^2$.

Thereafter, the positive-working photoresist layer is subjected to laser beam machining in the following manner. A laser beam generated by an excimer laser (KrF, 48 nm) equipped with two mirrors which could be manipulated in two directions perpendicular to each other under control by a computer was applied to the surface of the photoresist layer at an exposure intensity of 1 $J/cm^2$ while scanning at a speed of 1 cm/sec so as to form a desired fine line pattern of grooves in the photoresist layer. Under these conditions, the photoresist layer in those areas to which the laser beam had been applied was completely removed so as to expose the underlying alumina substrate, thereby forming a pattern of grooves having a line width of 15 $\mu$m and a line spacing of 15 $\mu$m in the photoresist layer.

The resulting grooves were filled with a Cu-based conductive paste which consisted of 81 wt % of a copper powder (average particle diameter=1 $\mu$m), 4 wt % of a lead borosilicate glass frit (softening point=500° C.), and 15 wt % of a vehicle which was pine oil containing an acrylate resin dissolved therein. A small amount of the conductive paste was placed on the surface of the positive-working photoresist layer and squeezed into the grooves in the photoresist layer with a squeegee made of a fluoroplastic resin. A part of the conductive paste was undesirably deposited on the top surface of the photoresist layer during squeezing and it was removed by scraping with a clean fluoroplastic squeegee, although complete removal of such undesirable conductive paste was impossible by scraping alone.

Subsequently, the conductive paste in the grooves of the photoresist layer was dried by heating at 90° C. for 5 minutes, whereby the dried conductive paste adhered to the alumina substrate by the binding action of the binder resin present therein. Thereafter, the undesirable conductive paste which still remained on the top surface of the photoresist layer after scraping was completely removed by polishing the surface of the photoresist layer with a lapping film to which alumina abrasive grains (1 $\mu$m diameter) were bonded.

The alumina substrate having the positive-working photoresist layer was then immersed with shaking in a developing solution (AZ400K sold by Hoechst Japan Ltd. diluted with 4 volumes of water) to remove the photoresist layer by dissolution while leaving the dried conductive paste on the alumina substrate.

The alumina substrate having thereon a pattern of the dried conductive paste was finally subjected to a 70 minutelong firing procedure in a nitrogen atmosphere during which the substrate was kept at a maximum temperature of 900° C. for 10 minutes. By firing, the organic matter in the conductive paste was decomposed away and the metallic component therein was sintered to form a fine, thick-film, Cu interconnecting pattern.

The interconnecting pattern was examined with a scanning electron microscope and it was found to be a very fine and precise thick-film conductor pattern having a line width of 14 μm, a line spacing of 16 μm, and a thickness of 10 μm.

Example 5

A fine, thick-film, Mo—Mn interconnecting pattern was formed on an alumina substrate in the same manner as described in Example 4, except that the conductive paste consisted of 64 wt % of a molybdenum powder (average particle diameter=0.5 μm), 16 wt % of a manganese powder (average particle diameter=3 μm), and 20 wt % of a pine oil-based vehicle containing an acrylate resin dissolved therein and that the firing was performed at 1,500° C. in an atmosphere consisting of nitrogen (90 vol %) and hydrogen (10 vol %) in the presence of a slight amount of water vapor.

The resulting interconnecting pattern formed after firing was examined with a scanning electron microscope and it was found to be a very fine and precise thick-film pattern having a line width of 13 μm, a line spacing of 17 μm, and a thickness of 10 μm.

Example 6

An alumina substrate (surface roughness=±3 μm) was bar-coated with a liquid negative-working photoresist (PMER N-HC600 sold by Tokyo Ohka Kogyo Co., Ltd.) to a thickness of 25 μm and the wet coating was dried in an oven at 70° C. for 30 minutes to form a negative-working photoresist layer.

The negative-working photoresist layer was then subjected to laser beam machining in the same manner as described in Example 4, except that scanning was modified so as to form grooves in a bump pattern. The resulting grooves formed in the negative-working photoresist layer had a bump diameter of 20 μm and a bump-to-bump pitch of 20 μm.

The bump-shaped grooves formed in the negative-working photoresist layer was filled with an Mo—Mn based conductive paste by squeezing the paste into the grooves in the same manner as in Example 4 using a fluoroplastic squeegee. The conductive paste consisted of 85 wt % of a mixture of a molybdenum powder and a manganese powder both having an average particle diameter of 3 μm at a weight ratio of 80:20, 5 wt % of an acrylate resin as a binder, and 10 wt % of turpentine oil as a solvent.

The conductive paste in the grooves was dried by heating at 90° C. for 10 minutes thereby causing the dried conductive paste to adhere to the alumina substrate by the action of the binder.

The negative-working photoresist layer formed on the alumina substrate and having grooves filled with the dried conductive paste was then treated with a developing solution (PMER N-A5 sold by Tokyo Ohka Kogyo Co., Ltd.) by immersing the substrate in the solution with shaking. As a result only the photoresist layer was removed by dissolution while leaving the dried conductive paste on the alumina substrate.

The alumina substrate was fired at 1,500° C. in a nitrogen and hydrogen mixed gas atmosphere in the presence of a slight proportion of water vapor, whereby the organic matter in the conductive paste was decomposed away and the metallic component therein was sintered to form a pattern of Mo—Mn bumps on the alumna substrate. The bumps were then plated with Ni and Au.

The bump height on the ceramic substrate was measured in the same manner as described in Example 3. All the bumps measured had a very uniform height with fluctuations within 2 μm. In addition, no short circuit was found between bumps by microscopic observation.

The alumina substrate having these bumps thereon was used to mount an IC chip by flip-chip bonding between the bumps of the substrate and those of the IC chip. No connection failure was found between the two groups of bumps.

The following Examples 7 and 8 illustrate an embodiment of the invention in which a pattern of conductive paste formed on a support film is transferred to a ceramic green sheet under pressure.

Example 7

A polyester support film having a release coating on the surface thereof (CERAPEEL sold by Toyo Metallizing Co., Ltd.) was roll-coated with a liquid positive-working photoresist (AZ4903 sold by Hoechst Japan Ltd.) and the applied wet coating was dried in an oven at 90° C. for 30 minutes to form a positive-working photoresist layer having a thickness of 25 μm on the support film.

The positive-working photoresist layer on the support film was then subjected to imagewise exposure to UV light at an exposure energy of 700 mJ/cm$^2$ through a photomask having an interconnecting pattern with a line width of 50 μm and a line spacing of 100 μm.

The exposed positive-working photoresist layer was then developed by immersing the support film in a developing solution (AZ400K sold by Hoechst Japan Ltd. diluted with 4 volumes of water) with shaking, thereby forming a pattern of grooves in the photoresist layer on the support film.

After the film support was heated on a hot plate at 120° C. for about 30 seconds to strengthen the grooved photoresist layer, the photoresist layer was subjected to blanket exposure to UV light at an exposure energy of 700 mJ/cm$^2$.

Subsequently, the grooves formed in the photoresist layer on the support film was filled with a W-based conductive paste consisting of 92 wt % of a tungsten powder (average particle diameter=2 μm), 3 wt % of an acrylate resin, and 5 wt % of turpentine oil by squeezing with a fluoroplastic squeegee, which was moved horizontally in contact with the surface of the photoresist layer such that the conductive paste was squeezed into the grooves. dried conductive paste was placed on each alumina ceramic green sheet with the dried conductive paste facing the green sheet. The resulting assembly was set on a press and a pressing force of 20 kg/cm$^2$ was applied thereto for 30 seconds at a temperature of 90° in order to transfer the pattern of the dried conductive paste to the ceramic green sheet. Thereafter, the support film was stripped off while leaving the dried conductive paste embedded in the alumina ceramic green sheet.

Subsequently, the via holes of the ceramic green sheets were filled with a conductive paste by a conventional screen-printing technique.

A plurality of the resulting alumina ceramic green sheets each having an embedded fine conductor pattern formed by the above-described process were laminated by thermocompressing on a hot press at 100–120° C. and the laminate was fired in a reducing gas atmosphere consisting of 50 vol % $N_2$ and 50 vol % $H_2$ at 1,500–1,600° C. to form a multilayer alumina ceramic circuit substrate.

The fired multilayer alumina ceramic circuit substrate had interconnecting patterns having a line width of 40 μm and a minimal line spacing of 25 μm. The cross-sectional profile of the interconnecting lines, when observed with a scanning electron microscope (SEM), was found to be rectangular. Examination under SEM and visual inspection revealed that the multilayer ceramic circuit substrate was completely free from defects of the interconnecting lines such as short circuit, and those of the substrate such as delamination and warpage.

Example 8

A multilayer ceramic circuit substrate was fabricated in the same manner as described in Example 7 except the following points: the conductive paste was an Ag-based one consisting of 85 wt % of an Ag powder (average particle diameter=2 μm), 4 wt % of an acrylate resin, and 11 wt % of turpentine oil; the ceramic green sheet was prepared from 100 parts of a mixture of 60 wt % of an alumina powder and 40 wt % of a glass powder ($CaO-Al_2O_3-B_2O_3-SiO_2$), 13 parts of a methacrylate resin as a to the ceramic green sheet. Thereafter, the support film was peeled off while leaving the dried conductive paste, which was embedded in the alumina ceramic green sheet.

Subsequently, the via holes of the ceramic green sheets were filled with a conductive paste by a conventional screen printing technique.

A plurality of the resulting alumina ceramic green sheet each having an embedded fine conductor pattern formed by the above-described process were laminated by thermo-compressing on a hot press at 100–120° C. and the laminate was fired in reducing gas atmosphere consisting of 50 vol % $N_2$ and 50 vol % at 1,500–1,600° C. to form a multilayer alumina ceramic circuit substrate.

The multilayer alumina ceramic circuit substrate had interconnecting patterns of W having a line width of 40 μm are a minimal line spacing of 25 μm. The cross-sectional profile of the interconnecting lines, when observed with a scanning electron microscope (SEM), was found to be rectangular. Examination under SEM and visual inspection revealed that the multilayer ceramic circuit substrate was completely free from defects of the interconnecting lines such as short circuit and connection failure as well as those of the substrate such as delamination and warpage.

Example 8

A multilayer ceramic circuit substrate was fabricated in the same manner as described in Example 7 except the following points: the conductive paste was an Ag-based one consisting of 85 wt % of an Ag powder (average particle diameter=2 μm), 4 wt % of an acrylate resin, and 11 wt % of turpentine oil; the ceramic green sheet was prepared from a slurry consisting of 100 parts of a mixture of 60 wt % of an alumina powder and 40 wt % of a glass powder ($CaO-Al_2O_3-B_2O_3-SiO_2$), 13 parts of a methacrylate resin as a binder, 5 parts of dioctyl phthalate as a plasticizer, and 27 parts of a toluene/isopropyl alcohol mixed solvents; and the firing of the laminate was performed at 890° C. in air.

The resulting fired multilayer alumina-glass ceramic circuit substrate had interconnecting patterns having a line width of 40 μm and a minimal line spacing of 25 μm. The cross-sectional profile of the interconnecting lines, when observed with a scanning electron microscope (SEM), was found to be rectangular. Examination under SEM and visual inspection revealed that the multilayer ceramic circuit substrate was completely free from defects of the interconnecting lines such as short circuit and connection failure, and those of the substrate such as delamination and warpage.

Comparative Example 3

A multilayer alumina ceramic circuit substrate was fabricated in the same manner as described in Example 7, except that prior to coating of the support film with the positive-working photoresist, a silicone oil was applied to the support film to enhance the releasing properties and that in the pattern transfer step, the dried conductive paste formed on the support film was transferred to the green sheet at 90° C. under no substantial pressure, i.e., by lightly pressing the paste onto the green sheet.

The resulting fired multilayer alumina ceramic circuit substrate had interconnecting patterns having a line width of 40 μm and a minimal line spacing of 25 μm. The cross-sectional profile of the interconnecting lines, when observed with a scanning electron microscope (SEM), was found to be nearly rectangular. However, examination under SEM and visual inspection revealed that voids were formed at the ends of the interconnecting lines and that partial delamination of the substrate occurred.

The following Examples 9 and 10 illustrate an embodiment of the invention in which bumps are formed on a ceramic substrate.

Example 9

A positive-working photoresist layer was formed in the same manner as described in Example 1 on the surface of an alumina ceramic substrate (surface roughness=±3 μm) having internal interconnecting lines. The photoresist layer was subjected to imagewise exposure in exactly the same manner as described in Example 3 using the photomask having a bump pattern with a bump diameter of 50 μm and a bump-to-bump pitch of 100 μm.

Following the imagewise exposure, the positive-working photoresist layer was developed to form bump-shaped grooves in the photoresist layer and then subjected to heating and blanket exposure in the same manner as described in Example 1.

The grooves formed in the photoresist layer were then filled by squeezing with an Mo—Mn based conductive paste having the same composition as that used in Example 3 in which the Mo and Mn powders both had an average particle diameter of 3 μm. The squeezing was performed in the same manner as described in Example 7 using a Teflon™ squeegee and without using a screen mask. The polishing with the lapping film, however, was performed only when a thin layer of the conductive paste remained on the photoresist layer after scraping with a clean squeegee.

Following filling with the conductive paste and drying thereof, the alumina ceramic substrate and the overlying photoresist layer having grooves filled with the dried conductive paste was processed by removal of the photoresist layer with a developing solution and firing in the same manner as described in Example 1 to form metallic (Mo—Mn) bumps on the surface of the alumina ceramic substrate. The metallic bumps were finally plated with Ni and Au.

Example 10

Using an alumina-cordierite ceramic substrate having internal Ag interconnecting lines as a ceramic substrate, the formation of a positive-working photoresist layer and the subsequent formation of a pattern of bump-shaped grooves were performed in the same manner as described in Example 9 to form a positive-working photoresist layer having a pattern of bump-shaped grooves on the ceramic substrate.

Following heating and blanket exposure, the grooves in the photoresist layer were filled by squeezing with a Cu-based conductive paste having the same composition as that used in Example 9 except that the powder material was a mixture of a Cu powder (average particle diameter=2 μm) and a lead borosilicate glass powder at a weight ration of 95:5. The squeezing and the subsequent steps including drying of the paste and removal of the photoresist layer with a developing solution were performed in the same manner as described in Example 9. Thereafter, the ceramic substrate was fired at 900° C. in a nitrogen atmosphere to sinter the Cu powder, whereby Cu bumps were formed on the ceramic substrate. The bumps were subsequently plated.

The ceramic circuit substrates having bumps formed in Examples 9 and 10 were evaluated for fluctuation in the bump height and incidence of short circuit between bumps. They were also evaluated for percent failure of soldered joints when an electronic device was mounted on each of the ceramic substrates by flip-chip bonding between the bumps of the substrate and those of the IC chip through a solder. The results are shown in Table 1 below.

The fluctuation in the bump height was determined by measuring the bump height for each two hundred samples prepared in Examples 9 and 10 with the same surface profilometer as used in Example 3 and the difference between the maximum and minimum values was taken as the fluctuation.

The incidence of short circuit between bumps was determined by observing the shape of each bump under an optical microscope to detect any short circuit between bumps.

The percent failure of soldered joints was determined by applying a solder to the bumps of both the electronic device to be mounted and the ceramic substrate to be tested and joining the two parts through the solder by heating in a conventional manner. Each two hundred samples prepared in Examples 9 and 10 were tested in this way to determine whether any failure in electrical connection occurred between facing bumps and the percent failure of soldered joints was calculated.

Comparative Examples 4 and 5

For comparison, bumps were formed on a ceramic substrate by a conventional direct screen printing technique.

In Comparative Example 4, the same Mo—Mn based conductive paste as used in Example 9 was screen-printed in a bump pattern directly onto the same alumina ceramic substrate as used in Example 9. Thereafter, firing and plating of the resulting bumps were performed as in Example 9.

In Comparative Example 5, the same Cu-based conductive paste as used in Example 10 was screen-printed in a bump pattern directly onto the same ceramic substrate as used in Example 10. Thereafter, firing and plating of the resulting bumps were performed as in Example 10.

The ceramic circuit substrates having bumps prepared in Comparative Examples 9 and 10 were evaluated by the same methods as employed in Examples 9 and 10. The test results are also shown in Table 1.

TABLE 1

| Example No. | Fluctuation in bump height, μm | % Short circuit | % Failure of soldered joint |
|---|---|---|---|
| Example 9 | 1 | 0 | 0 |
| Example 10 | 1 | 0 | 0 |
| Comparative Example 4 | 5 | 50 | 15 |
| Comparative Example 5 | 5 | 48 | 15 |

As is apparent from Table 1, the ceramic circuit substrates of Examples 9 and 10 having bumps formed by a lithographic technique showed a high uniformity in the bump height (fluctuation=1 μm) and their bump shape was neat and accurate with no short circuit between bumps. Furthermore, in the flip-chip bonding test through a solder, all the soldered joints between bumps had good electrical connections with the percent failure being zero.

In contrast, in Comparative Examples 4 and 5 where bumps were formed by a conventional direct screen printing technique, the fluctuation in the bump height was as great as 5 μm and, in addition, due to a failure to form the desired accurate bump shape owing to the occurrence of blur or slump of the paste, the incidence of short circuit between bumps was as high as about 50%. Similarly, in the flip-chip bonding test, many of the soldered joints resulted in poor electrical connections due to the great fluctuation in the bump height.

The following Examples 11–24 illustrate an embodiment of the invention in which a hydrocarbon solvent is used in the conductive paste.

Example 11

A sintered alumina ceramic substrate was processed by coating with a photoresist followed by drying as described in Example 1 to form a positive-working photoresist layer having a thickness of 25 μm on the substrate.

The photoresist layer was then subjected to imagewise exposure to UV light to give an exposure energy of 700 mJ/cm$^2$ through a photomask having an interconnecting pattern with a line width of 50 μm and a line spacing of 40 μm. Thereafter, the photoresist layer was developed in the same manner as in Example 1 to form grooves in the layer.

The ceramic substrate was then heated in an oven at 90° C. for 40 minutes to enhance the toughness of the photoresist layer, which was then subjected to blanket exposure to UV light at an exposure energy of 700 mJ/cm$^2$.

Separately, an Mo—Mn based conductive paste was prepared using a hydrocarbon solvent by mixing 90 parts of a powder mixture consisting of a molybdenum powder, a manganese powder, a titanium oxide powder, and a silica powder at a weight ratio of 75:15:5:5 with 4 parts of phenylcyclohexane (a hydrocarbon solvent) and 6 parts of an isobutylmethacrylate resin (binder).

The conductive paste was used to fill the grooves formed in the photoresist layer on the ceramic substrate by squeezing with a Teflon® squeegee. The filled conductive paste was then dried in an oven at 90° C. for 10 minutes so that the dried conductive paste adhered to the ceramic substrate by the binding action of the resin present therein. Thereafter, the surface of the photoresist layer was polished for 10 seconds with a lapping film (having a coating of 1 μm abrasive alumina grains) to remove the conductive paste which had undesirably been deposited on the top surface of the photoresist layer during squeezing. Refilling with the conductive paste was performed by squeezing in a direction perpendicular to the first filling direction and followed by drying and polishing in the same manner as above, in order to ensure that all the grooves in the photoresist layer were completely filled with the conductive paste while no excess paste remained in the areas other than the grooves.

Thereafter, removal of the photoresist layer with a developing solution and the subsequent firing were performed in the same manner as described in Example 1 to form an Mo—Mn interconnecting pattern on the alumina ceramic substrate.

The interconnecting pattern was examined with a scanning electron microscope (SEM) and it was found to have a very high precision (line width=45±2 μm). Observation under an optical microscope revealed that no short circuit was formed between interconnecting lines.

The use of phenylcyclohexane having a boiling point of about 240° C. as a solvent in the conductive paste made it easy to handle the conductive paste.

Example 12

An Mo—Mn interconnecting pattern was formed on a sintered alumina ceramic substrate by exactly the same procedure as described in Example 11 except that bicyclohexyl having a boiling point of about 220° C. was used as a solvent in the conductive paste.

The pattern precision by SEM examination was very high (line width=45±2 μm) and no short circuit was found between interconnecting lines by observation under an optical microscope. The conductive paste was easy for handling during squeezing.

Example 13

An Mo—Mn interconnecting pattern was formed on a sintered alumina ceramic substrate by exactly the same procedure as described in Example 11 except that dodecylbenzene having a boiling point of about 331° C. was used as a solvent in the conductive paste.

The pattern precision by SEM examination was very high (line width=45±2 μm) and no short circuit was found between interconnecting lines by observation under an optical microscope. The conductive paste was easy for handling during squeezing.

Example 14

An interconnecting pattern was formed on a sintered alumina ceramic substrate by exactly the same procedure as described in Example 11 except that pentylbenzene having a boiling point of about 205° C. was used as a solvent in the conductive paste.

The pattern precision by SEM examination was very high (line width=45±2 μm) and no short circuit was found between interconnecting lines by observation under an optical microscope. The conductive paste was easy for handling during squeezing.

Example 15

An interconnecting pattern was formed on a sintered alumina ceramic substrate by exactly the same procedure as described in Example 11 except that dipentylbenzene having a boiling point of about 260° C. was used as a solvent in the conductive paste.

The pattern precision by SEM examination was very high (line width=45±2 μm) and no short circuit was found between interconnecting lines by observation under an optical microscope. The conductive paste was easy for handling during squeezing.

Example 16

An interconnecting pattern was formed on a sintered alumina ceramic substrate by exactly the same procedure as described in Example 11 except that tetralin having a boiling point of about 207° C. was used as a solvent in the conductive paste.

The pattern precision by SEM examination was very high (line width=45±2 μm) and no short circuit was found between interconnecting lines by observation under an optical microscope. The conductive paste was easy for handling during squeezing.

Example 17

An interconnecting pattern was formed on a sintered alumina ceramic substrate by exactly the same procedure as described in Example 11 except that dodecane having a boiling point of about 216° C. was used as a solvent in the conductive paste.

The pattern precision by SEM examination was very high (line width=45±2 μm) and no short circuit was found between interconnecting lines by observation under an optical microscope. The conductive paste was easy for handling during squeezing.

Example 18

An interconnecting pattern was formed on a sintered alumina ceramic substrate by exactly the same procedure as described in Example 11 except that a mixture of phenylcyclohexane and bicyclohexyl (1:1) was used as a solvent in the conductive paste.

The pattern precision by SEM examination was very high (line width=45±2 μm) and no short circuit was found between interconnecting lines by observation under an optical microscope. The conductive paste was easy for handling during squeezing.

Example 19

An interconnecting pattern was formed on a sintered alumina ceramic substrate by exactly the same procedure as described in Example 11 except that a mixture of phenylcyclohexane and dodecylbenzene (1:1) was used as a solvent in the conductive paste.

The pattern precision by SEM examination was very high (line width=45±2 μm) and no short circuit was found between interconnecting lines by observation under an optical microscope. The conductive paste was easy for handling during squeezing.

Example 20

An interconnecting pattern was formed on a sintered alumina ceramic substrate by exactly the same procedure as described in Example 11 except that toluene was used as a solvent in the conductive paste.

The pattern precision by SEM examination was very high (line width=45±2 μm) and no short circuit was found between interconnecting lines by observation under an optical microscope.

Example 21

An interconnecting pattern was formed on a sintered alumina ceramic substrate by exactly the same procedure as described in Example 11 except that xylene was used as a solvent in the conductive paste.

The pattern precision by SEM examination was very high (line width=45±2 μm) and no short circuit was found between interconnecting lines by observation under an optical microscope.

Example 22

An interconnecting pattern was formed on a sintered alumina ceramic substrate by exactly the same procedure as described in Example 11 except that camphor oil was used as a solvent in the conductive paste.

The pattern precision by SEM examination was very high (line width=45±2 μm) and no short circuit was found between interconnecting lines by observation under an optical microscope.

Example 23

An interconnecting pattern was formed on a sintered alumina ceramic substrate by exactly the same procedure as described in Example 11 except that turpentine oil was used as a solvent in the conductive paste.

The pattern precision by SEM examination was very high (line width=45±2 μm) and no short circuit was found between interconnecting lines by observation under an optical microscope.

Example 24

An interconnecting pattern was formed on a sintered alumina ceramic substrate by exactly the same procedure as described in Example 11 except that pine oil was used as a solvent in the conductive paste.

The pattern precision by SEM examination was very high (line width=45±2 μm) and no short circuit was found between interconnecting lines by observation under an optical microscope.

Comparative Example 6

An interconnecting pattern was formed on a sintered alumina ceramic substrate by exactly the same procedure as described in Example 11 except that terpineol, which was not a hydrocarbon, was used as a solvent in the conductive paste.

In this case, the excess paste which had been undesirably deposited on the top surface of the photoresist layer during squeezing could not be completely removed by polishing or other means. The interconnecting pattern formed after the final firing step was examined in the same manner as in Example 11. The pattern precision was very low (line width=45±20 μm) and short circuit was found between interconnecting lines in some areas.

Comparative Example 7

An interconnecting pattern was formed on a sintered alumina ceramic substrate by exactly the same procedure as described in Example 11 except that a mixture of terpineol and dibutylcarbitol (1:1) was used as a solvent in the conductive paste.

In this case, the excess paste which had been undesirably deposited on the top surface of the photoresist layer during squeezing could not be completely removed by polishing or other means. The interconnecting pattern formed after the final firing step was examined in the same manner as in Example 11. The pattern precision was very low (line width=45±20 μm) and short circuit was found between interconnecting lines in some areas.

Comparative Example 8

An interconnecting pattern was formed on a sintered alumina ceramic substrate by exactly the same procedure as described in Example 11 except that a mixture of terpineol and dibutyl phthalate (3:1) was used as a solvent in the conductive paste.

In this case, the excess paste which had been undesirable deposited on the top surface of the photoresist layer during squeezing could not be completely removed by polishing or other means. The interconnecting pattern formed after the final firing step was examined in the same manner as in Example 11. The pattern precision was very low (line width=45±20 μm) and short circuit was found between interconnecting lines in some areas.

Comparative Example 9

An interconnecting pattern was formed on a sintered alumina ceramic substrate by exactly the same procedure as described in Example 11 except that hexanol, an alcoholic solvent, was used as a solvent in the conductive paste.

In this case, the excess paste which had been undesirably deposited on the top surface of the photoresist layer during squeezing could not be completely removed by polishing or other means. The interconnecting pattern formed after the final firing step was examined in the same manner as in Example 11. The pattern precision was very low (line width=45±20 μm) and short circuit was found between interconnecting lines in some areas.

Comparative Example 10

An interconnecting pattern was formed on a sintered alumina ceramic substrate by exactly the same procedure as described in Example 11 except that butylcarbitol acetate was used as a solvent in the conductive paste.

In this case, the excess paste which had been undesirably deposited on the top surface of the photoresist layer during squeezing could not be completely removed by polishing or other means. The interconnecting pattern formed after the final firing step was examined in the same manner as in Example 11. The pattern precision was very low (line width=45±20 μm) and short circuit was found between interconnecting lines in some areas.

Comparative Example 11

An interconnecting pattern was formed on a sintered alumina ceramic substrate by exactly the same procedure as described in Example 11 except that 2,2,4-trimethylpentanediol 1,3-monoisobutyrate was used as a solvent in the conductive paste.

In this case, the excess paste which had been undesirably deposited on the top surface of the photoresist layer during squeezing could not be completely removed by polishing or other means. The interconnecting pattern formed after the final firing step was examined in the same manner as in Example 11. The pattern precision was very low (line width=45±20 μm) and short circuit was found between interconnecting lines in some areas.

The following Examples 25–32 illustrate an embodiment of the invention in which a squeegee having a suitable flexural strength is used for filling with the conductive paste.

Example 25

An alumina ceramic substrate was processed by coating with a photoresist followed by drying as described in Example 1 to form a positive-working photoresist layer having a thickness of 25 μm on the substrate.

The photoresist layer was then subjected to imagewise exposure to UV light to give an exposure energy of 700 mJ/cm$^2$ through a photomask having an interconnecting pattern with a line width of 75 μm and a line spacing of 25 μm and a pad pattern with a diameter of 2 mm for pin joining. Thereafter, the photoresist layer was developed in the same manner as in Example 1 to form grooves in the layer.

The ceramic substrate was then dried in an oven at 90° C. for 40 minutes to enhance the toughness of the photoresist layer, which was then subjected to blanket exposure to UV light at an exposure energy of 700 mJ/cm$^2$.

The grooves formed in the photoresist layer on the ceramic substrate were then filled with a conductive paste by squeezing the paste into the grooves using a plate-like squeegee (40×100×3 mm) made of a tetrafluoroethylene resin (Teflon TFE$^{RT}$ sold by Mitsui du Pont Fluorochemical, flexural modulus=50 kgf/mm$^2$). The conductive paste consisted of 90 wt % of a powder mixture [containing 75 parts of a molybdenum powder (average particle diameter=1.5 μm), 15 parts of a manganese powder (average particle diameter=2 μm), 5 parts of a titanium oxide powder (average particle diameter=0.5 μm), and 5 parts of a silica powder (average particle diameter=2.5 μm], 6 wt % of an isobutyl methacrylate resin, and 4 wt % of phenylcyclohexane. The squeegee was moved at a constant speed of 2.5 mm/sec.

The alumina ceramic substrate having thereon the photoresist layer with conductive paste-filled grooves was then heated in an oven at 90° C. for 10 minutes to dry the filled conductive paste and cause the dried conductive paste adhere to the ceramic substrate by the binding action of the resin present therein. Subsequently, the surface of the photoresist layer was polished for 10 seconds with a lapping film (having a coating of abrasive alumina grains with 1 μm particle diameter) to remove the undesirable part of the conductive paste deposited on the top surface of the photoresist layer to a thickness of about 2 μm. Refilling with the conductive paste was performed by squeezing in a direction perpendicular to the first filling direction and followed by drying and polishing in the same manner as above.

At the end of these squeezing procedures including drying and polishing, the surface of the photoresist layer was observed with a scanning electron microscope and found to be totally free from chipping or similar defects resulting from squeezing.

Thereafter, removal of the photoresist layer with a developing solution and the subsequent firing were performed in the same manner as described in Example 1 to form an Mo—Mn interconnecting and pad patterns on the alumina ceramic substrate.

The fine thick-film conductor patterns, when examined with a scanning electron microscope (SEM), had a very high precision (line width=68±2 μm) and were very flat and free from misshaped or chipped portions in both the interconnecting pattern and the pad pattern.

Example 26

Fine thick-film conductor patterns were formed on an alumina ceramic substrate in exactly the same manner as described in Example 25 except that the squeegee (having the same shape as in Example 25) was made of a perfluoroalkoxy resin (Teflon PFA$^{RT}$ sold by Mitsui du Pont Fluorochemical, flexural modulus=67 kgf/mm$^2$). The surface of the photoresist layer at the end of the squeezing procedures was found by SEM examination to be totally free from chipping or similar defects resulting from squeezing.

The fine thick-film conductor patterns, when examined by SEM, had a very high precision (line width=68±2 μm) and were very flat and free from misshaped or chipped portions in both the interconnecting line pattern and the pad pattern.

Example 27

Fine thick-film conductor patterns were formed on an alumina ceramic substrate in exactly the same manner as described in Example 25 except that the squeegee (having the same shape as in Example 25) was made of an ethylene-propylene fluoride resin (Teflon FEP$^{RT}$ sold by Mitsui du Pont Fluorochemical, flexural modulus=67 kgf/mm$^2$). The surface of the photoresist layer at the end of the squeezing procedures was found by SEM examination to be totally free from chipping or similar defects resulting from squeezing.

The fine thick-film conductor patterns, when examined by SEM, had a very high precision (line width=68±2 μm) and were very flat and free from misshaped or chipped portions in both the interconnecting line pattern and the pad pattern.

Example 28

Fine thick-film conductor patterns were formed on an alumina ceramic substrate in exactly the same manner as described in Example 25 except that the squeegee (having the same shape as in Example 25) was made of a polytetrafluoroethylene resin (Neoflon PFA$^{RT}$ sold by Daikin Industries, Ltd., flexural modulus=68 kgf/mm$^2$). The surface of the photoresist layer at the end of the squeezing procedures was found by SEM examination to be totally free from chipping or similar defects resulting from squeezing.

The fine thick-film conductor patterns, when examined by SEM, had a very high precision (line width=68±2 μm) and were very flat and free from misshaped or chipped portions in both the interconnecting line pattern and the pad pattern.

Example 29

Fine thick-film conductor patterns were formed on an alumina ceramic substrate in exactly the same manner as described in Example 25 except that the squeegee (having the same shape as in Example 25) was made of a tetrafluoroethylene-hexafluoropropylene copolymer resin (Neoflon FEP$^{RT}$ sold by Daikin Industries, Ltd., flexural modulus=60 kgf/mm$^2$). The surface of the photoresist layer at the end of the squeezing procedures was found by SEM examination to be totally free from chipping or similar defects resulting from squeezing.

The fine thick-film conductor patterns, when examined by SEM, had a very high precision (line width=68±2 μm) and were very flat and free from misshaped or chipped portions in both the interconnecting line pattern and the pad pattern.

Example 30

Fine thick-film conductor patterns were formed on an alumina ceramic substrate in exactly the same manner as described in Example 25 except that the squeegees (having the same shape as in Example 25) was made of a tetrafluoroethylene-ethylene copolymer resin (Neoflon ETFE$^{RT}$ sold by Daikin Industries, Ltd., flexural modulus= 120 kgf/mm$^2$). The surface of the photoresist layer at the end of the squeezing procedures was found by SEM examination to be totally free from chipping or similar defects resulting from squeezing.

The fine thick-film conductor patterns, when examined by SEM, had a very high precision (line width=68±2 μm) and were very flat and free from misshaped or chipped portions in both the interconnecting line pattern and the pad pattern.

Example 31

Fine thick-film conductor patterns were formed on an alumina ceramic substrate in exactly the same manner as described in Example 25 except that the squeegee (having the same shape as in Example 25) was made of a polyvinylidene fluoride resin (Neoflon VDF$^{RT}$ sold by Daikin Industries, Ltd., flexural modulus=180 kgf/mm$^2$). The surface of the photoresist layer at the end of the squeezing procedures was found by SEM examination to be totally free from chipping or similar defects resulting from squeezing.

The fine thick-film conductor patterns, when examined by SEM, had a very high precision (line width=68±2 μm) and were very flat and free from misshaped or chipped portions in both the interconnecting line pattern and the pad pattern.

Example 32

Fine thick-film conductor patterns were formed on an alumina ceramic substrate in exactly the same manner as described in Example 25 except that the squeegee (having the same shape as in Example 25) was made of a polychlorotrifluoroethylene resin (Neoflon CTFE$^{RT}$ sold by Daikin Industries, Ltd., flexural modulus=180 kgf/mm$^2$). The surface of the photoresist layer at the end of the squeezing procedures was found by SEM examination to be totally free from chipping or similar defects resulting from squeezing.

The fine thick-film conductor patterns, when examined by SEM, had a very high precision (line width=68±2 μm) and were very flat and free from misshaped or chipped portions in both the interconnecting line pattern and the pad pattern.

Comparative Example 12

Fine thick-film conductor patterns were formed on an alumina ceramic substrate in exactly the same manner as described in Example 25 except that the squeegee (having the same shape as in Example 25) was made of a natural rubber (flexural modulus=0.11 kgf/mm$^2$). After the filling with the conductive paste and subsequent drying, the alumina ceramic substrate was examined by SEM for completeness of filling and found that some grooves were not completely filled with the conductive paste.

Comparative Example 13

An alumina ceramic substrate was processed by forming a positive-working photoresist layer on the substrate, forming grooves in the photoresist layer, filling the grooves with a conductive paste, and drying the filled paste in the same manner as described in Example 25 except that the squeegee (having the same shape as in Example 25) was made of an epoxy resin (flexural modulus=255 kgf/mm$^2$).

As a result, the squeezing procedure caused the conductive paste to deposit with a thickness of about 10 μm over substantially the entire surface of the grooved photoresist layer. After the filled conductive paste was dried, the top surface of the photoresist layer on which the conductive paste was deposited was polished with a lapping film (having a coating of 1 μm alumina abrasive grains) in order to remove the undesirable remaining paste, but complete removal of such paste could not be achieved by polishing.

In a separate run, when the same squeegee made of an epoxy resin was used for squeezing several times, the squeegee became curved due to attack by the solvent in the conductive paste.

Comparative Example 14

An alumina ceramic substrate was processed by forming a positive-working photoresist layer on the substrate, forming grooves in the photoresist layer, and filling the grooves with a conductive paste in the same manner as described in Example 25 except that a copper plate (flexural modulus= 11.2×10$^3$ kgf/mm$^2$) was used as the squeegee. During squeezing, the positive-working photoresist layer was significantly damaged and some areas of the photoresist layer was chipped.

While the present invention have been described with respect to preferred embodiments, they are by no means intended as limiting and various modifications and variations can be made within the claimed scope of the invention.

What is claimed is:

1. A process for forming a fine thick-film conductor pattern on a ceramic substrate comprising the steps of:

(A) forming a positive-working photoresist layer on the ceramic substrate;

(B) forming grooves arranged in a predetermined fine pattern in the positive-working photoresist layer by exposing the photoresist layer to radiation through a photomask followed by development;

(C) filling the grooves formed in the photoresist layer with a conductive paste which comprises a conductor component, a binder, and a solvent by squeezing the paste into the grooves using a squeegee, said squeezing being performed by the screen printing technique using a mask having openings with a fine pattern of the same configuration as that of the grooves formed in the photoresist layer;

(D) drying the conductive paste in the grooves;

(E) subjecting the grooved positive-working photoresist layer to blanket exposure after step (B), (C), or (D);

(F) removing the positive-working photoresist layer by treatment with a developing solution while leaving a fine thick-film pattern of the dried conductive paste on the ceramic substrate; and (G) firing the substrate to sinter the conductor component in the conductive paste and form a fine thick-film conductor pattern bonded to the ceramic substrate.

2. A process according to claim 1, wherein the solvent in the conductive paste used in step (C) consists essentially of at least one hydrocarbon.

3. A process according to claim 2, wherein the hydrocarbon solvent has a boiling point in the range of 200–350° C.

4. A process according to claim 1, wherein the squeegee used in step (C) is made of a material having a flexural modulus in the range of 30–200 kgf/mm$^2$.

5. A process for forming a fine thick-film conductor pattern on a ceramic substrate comprising the steps of:

(A) forming a positive-working photoresist layer on the ceramic substrate;

(B) forming grooves arranged in a predetermined fine pattern in the photoresist layer by application of a laser beam to the layer;

(C) filling the grooves formed in the photoresist layer with a conductive paste which comprises a conductor component, a binder, and a solvent by squeezing the paste into the grooves using a squeegee;

(D) drying the conductive paste in the grooves;

(E) subjecting the grooved positive-working photoresist layer to blanket exposure after step (A), (B), (C), or (D);

(F) removing the positive-working photoresist layer by treatment with a developing solution while leaving a fine thick-film pattern of the dried conductive paste on the ceramic substrate; and (G) firing the substrate to sinter the conductor component in the conductive paste and form a fine thick-film conductor pattern bonded to the ceramic substrate.

6. A process according to claim 5, wherein the squeezing in step (C) is performed by the screen printing technique using a mask having openings with a fine pattern of the same configuration as that of the grooves formed in the photoresist layer in step (B).

7. A process according to claim 5, wherein the solvent in the conductive paste used in step (C) consists essentially of at least one hydrocarbon.

8. A process according to claim 7, wherein the hydrocarbon solvent has a boiling point in the range of 200–350° C.

9. A process according to claim 5, wherein the squeegee used in step (C) is made of a material having a flexural modulus in the range of 30–200 kgf/mm².

10. A process according to claim 5, wherein the fine thick-film pattern to be formed is in the shape of bumps.

11. A process for forming a fine thick-film conductor pattern on a ceramic substrate comprising the steps of:

(A) forming a layer of a soluble resin on the ceramic substrate;

(B) forming grooves arranged in a predetermined fine pattern in the soluble resin layer by application of a laser beam to the layer;

(C) filling the grooves formed in the resin layer with a conductive paste which comprises a conductor component, a binder, and a solvent by squeezing the paste into the grooves using a squeegee;

(D) drying the conductive paste in the grooves;

(E) removing the resin layer by dissolution while leaving a fine thick-film pattern of the dried conductive paste on the ceramic substrate; and (F) firing the substrate to sinter the conductor component in the conductive paste and form a fine thick-film conductor pattern bonded to the ceramic substrate.

12. A process according to claim 11, wherein the soluble resin layer formed in step (A) is a negative-working photoresist layer.

13. A process according to claim 11, wherein the squeezing in step (C) is performed by the screen printing technique using a mask having openings with a fine pattern of the same configuration as that of the grooves formed in the photoresist layer in step (B).

14. A process according to claim 11, wherein the solvent in the conductive paste used in step (C) consists essentially of at least one hydrocarbon.

15. A process according to claim 14, wherein the hydrocarbon solvent has a boiling point in the range of 200–350° C.

16. A process according to claim 11, wherein the squeegee used in step (C) is made of a material having a flexural modulus in the range of 30–200 kgf/mm².

17. A process according to claim 11, wherein the fine thick-film pattern to be formed is in the shape of bumps.

18. A process for forming a fine thick-film pattern conducted on a ceramic substrate comprising the steps of:

(A) forming a positive-working photoresist layer on the surface of a support film;

(B) forming grooves arranged in a predetermined fine pattern in the positive-working photoresist layer by exposing the photoresist layer to radiation through a photomask followed by development;

(C) filling the grooves formed in the photoresist layer with a conductive paste which comprises a conductor component a binder, and a solvent by squeezing the paste into the grooves using a squeegee;

(D) drying the conductive paste in the grooves;

(E) subjecting the grooved positive-working photoresist layer to blanket exposure after step (B), (C), or (D);

(F) removing the positive-working photoresist layer by treatment with a developing solution while leaving a predetermined fine thick-film pattern of the dried conductive paste on the support film;

(G) transferring the dried conductive paste from the support film onto a ceramic green sheet under pressure followed by removal of the support film from the conductive paste; and (H) co-firing the ceramic green sheet and the conductive paste transferred thereto.

19. A process according to claim 18, which further includes the following step (I) prior to step (H):

(I) forming a laminate of a plurality of ceramic green sheets, at least one of which has the dried conductive paste which has been transferred to the green sheet by a process comprising the steps (A) to (G).

20. A process according to claim 18, wherein the squeezing in step (C) is performed by the screen printing technique using a mask having openings with a fine pattern of the same configuration as that of the grooves formed in the photoresist layer in step (B).

21. A process according to claim 18, wherein the solvent in the conductive paste used in step (C) consists essentially of at least one hydrocarbon.

22. A process according to claim 21, wherein the hydrocarbon solvent has a boiling point in the range of 200–350° C.

23. A process according to claim 18, wherein the squeegee used in step (C) is made of a material having a flexural modulus in the range of 30–200 kgf/mm².

24. A process for forming bumps on a ceramic or glass circuit substrate comprising the steps of:

(A) forming a positive-working photoresist layer on the ceramic substrate;

(B) forming grooves arranged in a predetermined fine pattern to form bumps in the positive-working photoresist layer by exposing the photoresist layer to radiation through a photomask followed by development;

(C) filling the grooves formed in the photoresist layer with a conductive paste which comprises a conductor component, a binder, and a solvent by squeezing the paste into the grooves using a squeegee;

(D) drying the conductive paste in the grooves;

(E) subjecting the grooved positive-working photoresist layer to blanket exposure after step (B), (C), or (D);

(F) removing the positive-working photoresist layer by treatment with a developing solution while leaving a fine thick-film pattern of bumps made of the dried conductive paste on the ceramic substrate; and (G) firing the substrate to sinter the conductor component in the conductive paste and form bumps in a fine thick-film conductor pattern bonded to the ceramic substrate.

25. A process according to claim 24, wherein the squeezing in step (C) is performed by the screen printing technique using a mask having openings with a fine bump pattern of the same configuration as that of the grooves formed in the photoresist layer in step (B).

26. A process according to claim 24, wherein the solvent in the conductive paste used in step (C) consists essentially of at least one hydrocarbon.

27. A process according to claim 26, wherein the hydrocarbon solvent has a boiling point in the range of 200–350° C.

28. A process according to claim 24, wherein the squeegee used in step (C) is made of a material having a flexural modulus in the range of 30–200 kgf/mm$^2$.

29. A process for forming a fine thick-film conductor pattern on a ceramic substrate comprising the steps of:

(A) forming a positive-working photoresist layer on the ceramic substrate;

(B) forming grooves arranged in a predetermined fine pattern in the positive-working photoresist layer by exposing the photoresist layer to radiation through a photomask followed by development;

(C) filling the grooves formed in the photoresist layer with a conductive paste which comprises a conductor component, a binder, and a solvent by squeezing the paste into the grooves using a squeegee, said squeegee being made of a material having a flexural modulus in the range of 30–200 kgf/mm$^2$;

(D) drying the conductive paste in the grooves;

(E) subjecting the grooved positive-working photoresist layer to blanket exposure after step (B), (C), or (D);

(F) removing the positive-working photoresist layer by treatment with a developing solution while leaving a fine thick-film pattern of the dried conductive paste on the ceramic substrate; and (G) firing the substrate to sinter the conductor component in the conductive paste and form a fine thick-film conductor pattern bonded to the ceramic substrate.

30. A process according to claim 29, wherein the material for the squeegee used in step (C) is a fluoroplastic resin.

* * * * *